United States Patent
Li et al.

(10) Patent No.: US 11,854,808 B2
(45) Date of Patent: Dec. 26, 2023

(54) PHOTO MASK AND LITHOGRAPHY METHOD USING THE SAME

(71) Applicant: TAIWAN SEMICONDUCTOR MANUFACTURING COMPANY, LTD., Hsinchu (TW)

(72) Inventors: Bao-Chin Li, Tainan (TW); Chung-Kai Huang, Tainan (TW); Ko-Pin Kao, Taichung (TW); Ching-Yen Hsaio, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 95 days.

(21) Appl. No.: 17/461,800

(22) Filed: Aug. 30, 2021

(65) Prior Publication Data

US 2023/0066993 A1   Mar. 2, 2023

(51) Int. Cl.
| | |
|---|---|
| H01L 21/033 | (2006.01) |
| H01L 21/027 | (2006.01) |
| H01L 21/28 | (2006.01) |
| H10B 41/35 | (2023.01) |
| H10B 41/43 | (2023.01) |

(52) U.S. Cl.
CPC ...... H01L 21/0338 (2013.01); H01L 21/0274 (2013.01); H01L 29/40114 (2019.08); H10B 41/35 (2023.02); H10B 41/43 (2023.02)

(58) Field of Classification Search
CPC ............. H01L 21/0338; H01L 21/0274; H01L 21/0334; H01L 29/40114; H01L 29/665; H01L 29/6659; G03F 1/36; G03F 1/38; H10B 41/35; H10B 41/43
See application file for complete search history.

(56) References Cited

U.S. PATENT DOCUMENTS

| | | | |
|---|---|---|---|
| 5,636,002 A * | 6/1997 | Garofalo | G03F 7/70125 |
| | | | 355/71 |
| 2004/0248016 A1 | 12/2004 | Lucas et al. | |
| 2009/0244502 A1 | 10/2009 | Kuechler et al. | |
| 2013/0216795 A1 | 8/2013 | Zhou et al. | |

FOREIGN PATENT DOCUMENTS

| | | |
|---|---|---|
| CN | 103293846 A | 9/2013 |
| TW | 200509207 A | 3/2005 |

* cited by examiner

*Primary Examiner* — Nicholas J Tobergte
*Assistant Examiner* — Kevin Quinto
(74) *Attorney, Agent, or Firm* — Maschoff Brennan

(57) ABSTRACT

A photo mask includes a plurality of device features, a first assist feature, and a second assist feature. The device features are in a patterning region of a device region. The first assist feature are in the patterning region and adjacent to the device features. The first assist feature is for correcting an optical proximity effect in a photolithography process. The second assist feature is in a non-patterning region of the device region. The second assist feature is a sub-resolution correction feature, and a first distance between the second assist feature and one of the device features closest to the second assist feature is greater than a second distance between adjacent two of the device features.

20 Claims, 41 Drawing Sheets

PHOTO MASK AND LITHOGRAPHY METHOD USING THE SAME

BACKGROUND

Photolithography is a process used in semiconductor integrated circuit (IC) device fabrication to produce device structures on semiconductor or other substrates. Distortions of device structures are becoming evident in view of the shrinking of the dimensions of the device structures as compared to the radiation wavelengths used during photolithography. The challenges presented by sub-wavelength photolithography include image distortion in the form of line-end shortenings, corner rounding, isolated/dense proximity effects, and adverse impacts on the depth of focus (DOF). One source of distortion is due to light scattered or otherwise affected by adjacent structures. Distortion in size and shape of the projected image exhibited by this phenomenon is called proximity effect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
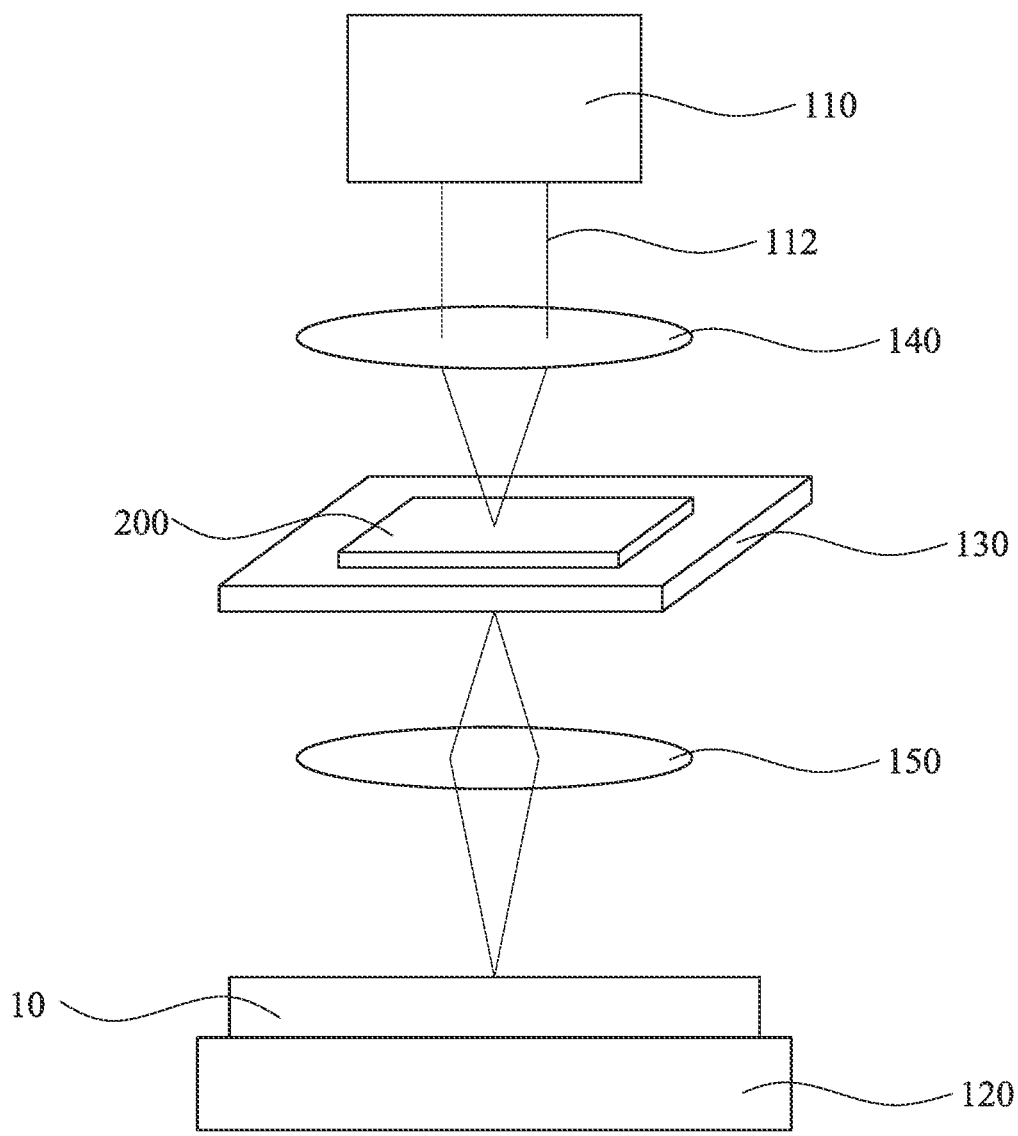
FIG. 1 illustrates a simplified photolithography system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

In light of the challenges presented by sub-wavelength photolithography, resolution enhancement technologies (RET) have been devised to extend the usable resolution of an imaging system without decreasing the wavelength of the light or increasing the numerical aperture of the imaging tool. RET includes phase-shifting masks, off-axis illumination (OAI), and optical proximity correction (OPC). Embodiments of the present disclosure provide new and unique assist features (or scattering bars) to improve the image distortion problem. The term scattering bars refer to both scattering bars and anti-scattering bars. The disclosure herein introduces assist features that are placed in a non-patterning region of a photo mask, which is a region without main features.

For example, when the photo mask is used for patterning features (e.g., control gates, floating gates, select gates, or other elements) of a flash memory device, a patterning region of the photo mask corresponds to a memory region of the flash memory device, and the non-patterning region of the photo mask corresponds to a logic region of the flash memory device. In this case, main features are disposed only in the pattering region and not in the non-patterning region of the photo mask. Further, some assist features are disposed in the non-patterning region of the photo mask to solve heating problem of the photo mask, thereby improving the image performance of the photolithography.

FIG. 1 illustrates a simplified photolithography system 100 in accordance with some embodiments of the present disclosure. The photolithography system 100 includes a light source 110 for projecting a radiation 112 onto a wafer 10 disposed on a wafer stage 120 through a photo mask (or a mask or a reticle) 200 supposed by a reticle holder 130. Various lenses (e.g., lens systems 140 and 150) can also be provided, as well as other light manipulating and/or transmitting devices. For example, the lens systems 140 is disposed between the light source 110 and the reticle holder 130, and the lens systems 150 is disposed between the reticle holder 130 and the wafer stage 120. In some embodiments, the lens system 140 includes a single lens or multiple lenses and/or other lens components. For example, the lens system 140 includes microlens arrays, shadow masks, or other structures designed to aid in directing the radiation 112 from the light source 110 onto the photo mask 200. In some embodiments, the lens system 150 is a projection optics box (POB), which includes refractive optics and/or reflective optics.

The radiation 112 may include an ultraviolet (UV) light (e.g., KrF (248 nm) light or ArF (I93 nm) light), an extreme ultraviolet (EUV) (13.5 nm) light, an electron beam, an X-ray or an ion beam. In furtherance of the present embodiments, the wafer 10 is a semiconductor wafer for receiving an integrated circuit pattern from the photo mask 200. The patterns from the photo mask 200 will appear on a layer of the wafer 10, thereby creating an integrated circuit device, or chip, when combined with other layers.

The radiation 112 projected from the light source 110 passes through the lens system 140 to the photo mask 200, and patterns of the photo mask 200 are imparted to the radiation 112, which then passes through the lens system 150 to the wafer 10. As such, the patterns from the photo mask 200 will appear on a layer of the wafer 10. In some embodiments, the photo mask 200 includes few patterns, resulting in most of the radiation 112 passing through the photo mask 200 to the lens system 150. In this case, the lens system 150 absorbs massive heat of the radiation 112 and begins to heat up. The massive heat of the lens system 150 causes distortion of the lenses in the lens system 150, resulting in image distortion of the patterns projected on the wafer 10.

Figure 2:
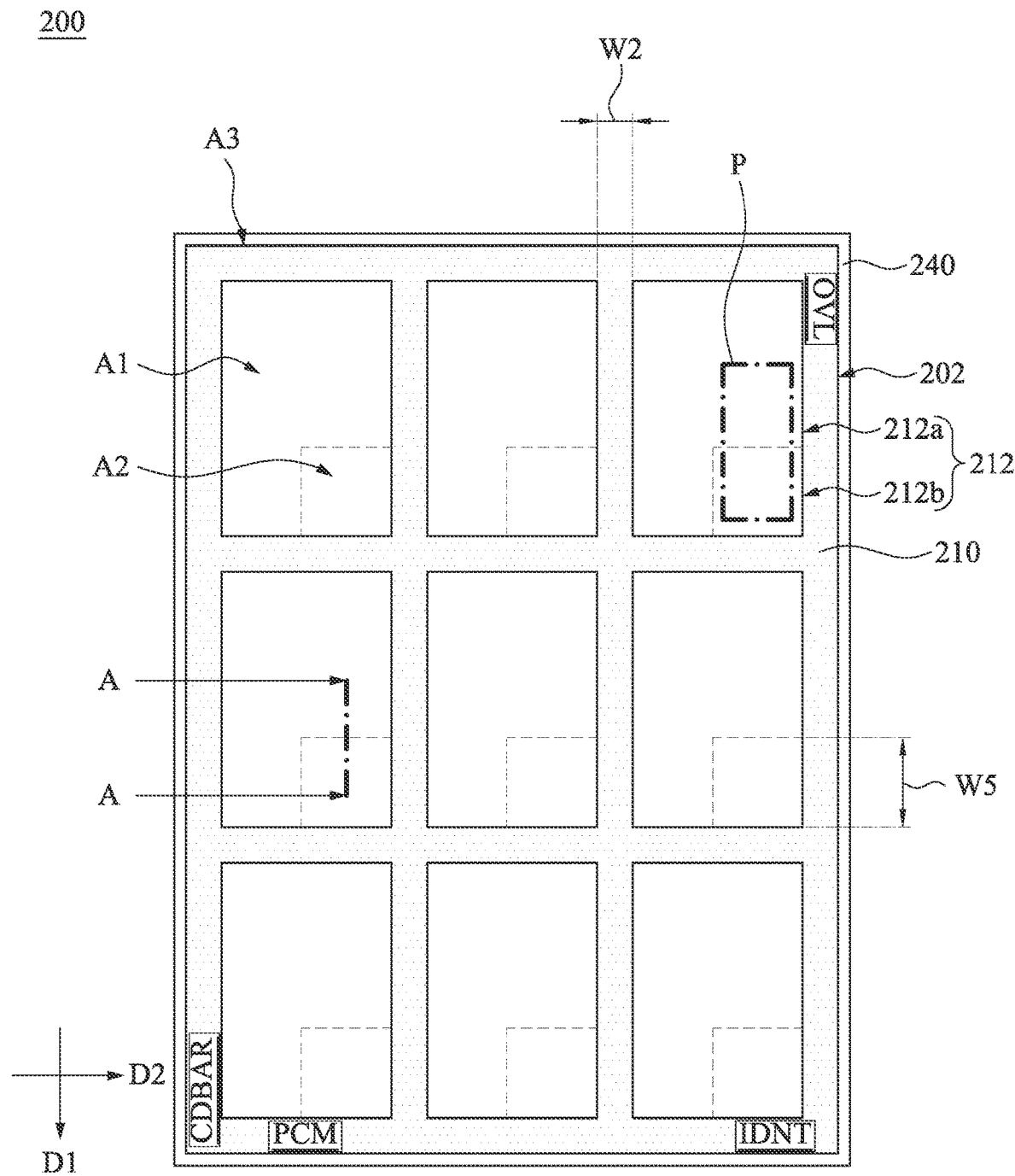
FIG. 2 illustrates a top view of a photo mask of FIG. 1 according to the present disclosure.
Figure 3A:
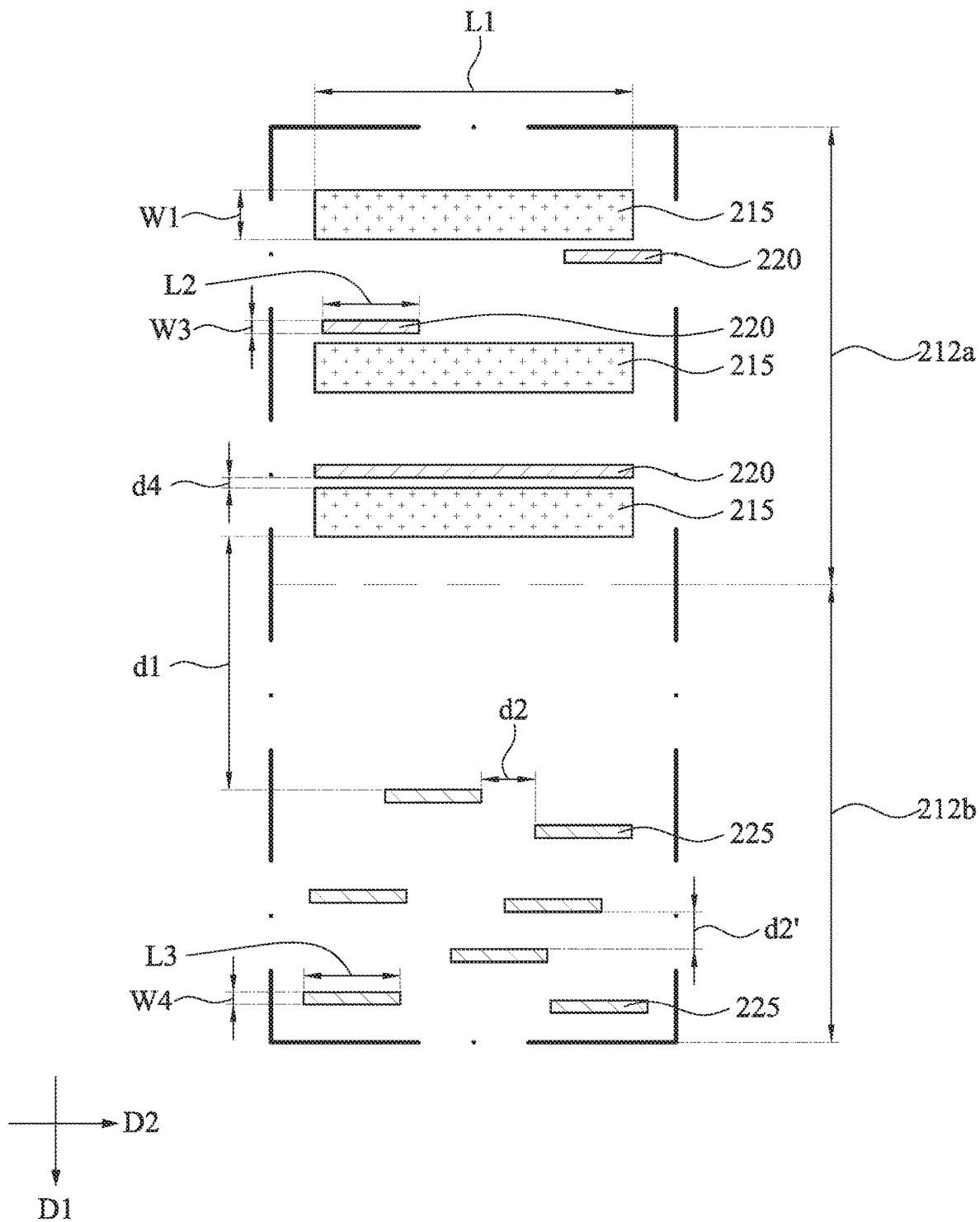
FIG. 3A is an enlarged view of an area P in FIG. 2 according to some embodiments.

As such, the photo mask 200 can be designed to solve the heating problem of the lens system 150. FIG. 2 illustrates a top view of the photo mask 200 of FIG. 1 according to the present disclosure, and FIG. 3A is an enlarged view of an area P in FIG. 2 according to some embodiments. Reference is made to FIGS. 2 and 3A. The photo mask 200 has an exposure field 202, which includes an area of the wafer 10 (see FIG. 1) covered (e.g., exposed) by a single exposure or "shot." In some embodiments, the photo mask 200 includes an absorb band 240, and the exposure field 202 is enclosed (and defined) by the absorb band 240. The photo mask 200 further includes main features 210, 215 and assist features 220, 225, placed in the exposure field 202 and in a configuration according to various aspects of the present disclosure. For clarity, the main features 215 and the assist features 220, 225 are illustrated in FIG. 3A and are omitted in FIG. 2. The configuration of the assist features 220 and 225 is described in greater detail below. Though described herein as being provided on the photo mask 200, the main features 210, 215 are equally illustrative of features and configurations (e.g., layouts) developed in the design of a device, for example, a design of an integrated circuit. For example, the configuration may be represented by data used during the design or fabrication processes, including a layout represented by a design file output, e.g., a GDS output.

The photo mask 200 may be a binary mask, phase-shift mask including attenuated phase shift mask (attPSM), alternating phase shift masks (altPSM), chromeless phase lithography (CPL), and/or other mask types. The photo mask 200 further includes a substrate 230 (see FIGS. 4A-4C). The substrate 230 may be a transparent substrate such as fused silica ($SiO_2$), or quartz, relatively free of defects, calcium fluoride, or other suitable material. The main features 210, 215, the assist features 220 and 225, and the absorb band 240 are disposed over or in the substrate 230 in some embodiments.

The main features 210 and 215 may be designed to form a portion of an integrated circuit pattern on a semiconductor wafer, such as the wafer 10 of FIG. 1. The main features 210 may be scribe line features that surround the main features 215. Specifically, the main features 210 define at least one device region 212, each of which corresponds to a die of the wafer 10. The scribe line features 210 can be transferred onto the wafer 10 to fabricate scribe lines on the wafer 10. A cutting operation utilizes a cutter to cut the wafer 10 into individual dies along the scribe lines. In some embodiments, the scribe line features (i.e., the main features 210) includes an overlay pattern OVL, a critical dimension bar pattern CDBAR, a process control monitor pattern PCM, an identification pattern IDNT, a frame cell (not shown), and/or a wafer acceptance test pattern (not shown). The overlay pattern OVL is used to align multiple layers formed on the wafer 10. The critical dimension bar CDBAR is designed to measure the dimensions of critical processes in the fabrication of a semiconductor device. The process control monitor pattern PCM includes such for measuring electrical parameters of active devices (threshold voltage, gate diode breakdown, channel length/width reduction, drain/source series resistance, etc), properties of passive devices (area capacitances, sheet resistance, contact/via resistance, etc.) and inline relevant parameters such as linewidth control, alignment, etc. The identification pattern IDNT is transformed to be an identification of the wafer 10. The positions of the overlay pattern OVL, the critical dimension bar pattern CDBAR, the process control monitor pattern PCM, and the identification pattern IDNT in FIG. 2 are illustrated and not limits the claimed scope.

The main features (or device features) 215 are placed in the device regions 212 and may be designed to form an integrated circuit feature such as contacts (e.g., vias), insulating regions, conductive lines, source/drain features, gates, doped regions, and/or other possible features. Though illustrated as rectangular, the main features 215 may include any variation of shape, size, and/or dimension. Further, the shapes, dimensions, sizes, and positions of the main features 215 may be modified during the design and mask making process.

In some embodiments, an optical proximity correction (OPC) process is applied to the photo mask 200 for resolution enhancement. Optical proximity correction is a photolithography enhancement technique used to compensate for image errors due to diffraction or process effects. It is used in wafer lithography to produce a printed image that matches the design intent while optimizing critical dimension control. Optical proximity correction improves image fidelity by adding and subtracting small enhancement shapes from the original pattern data. In some embodiments, the assist features 220 are added into the photo mask 200 and near the main features 215 to enhance resolution. The assist features 220 may be sub-resolution assist features. In another word, they are of dimensions such that the features will not image onto the wafer 10 when the photo mask 200 is irradiated. Though illustrated as rectangular, the assist features 220 may include any variation of shape, size, and/or dimension. Further, the shapes, dimensions, sizes, and positions of the assist features 220 may be modified during the design and mask making process.

In some embodiments, the photo mask 200 is used to expose only some regions of the wafer 10 (see FIG. 1). For example, the photo mask 200 is used to expose a memory region and not a logic region of memory devices, or vise versa. Alternatively, the photo mask 200 is used to expose a core region and not an input/output region of integrated circuits, or vise versa. In these cases, the main features 215 of the photo mask 200 may be distributed non-uniformly in the device region 212. Further, a large area of the device region 212 not occupied by the main features 215 (and the assist features 220) are empty and the radiation 112 can pass therethrough. The radiation 112 passes through the empty region may cause huge heat in the lens system 150 (see FIG. 1), which in turn results in image distortion on the wafer 10.

Some embodiments of the present disclosure provide the assist features 225 to solve the heating issue. Taking a photo mask for exposing memory devices as an example, the device region 212 has a patterning region 212a and a non-patterning region 212b. In some embodiments, the patterning region 212a and the non-patterning region 212b are arranged in a first direction D1. In some embodiments, an area A1 of the patterning region 212a may be greater than, equal to, or less than an area A2 of the non-patterning region 212b.

In some embodiments, the patterning region 212a corresponds to a memory region of the memory device, and the non-patterning region 212b corresponds to a logic region of the memory device. That is, a portion of the radiation 112 (see FIG. 1) passes through the patterning region 212a is incident on the memory region of the memory device, and another portion of the radiation 112 passes through the non-patterning region 212b is incident on the logic region of the memory device. The main features 215 and the assist features 220 are placed in the patterning region 212a, and not in the non-patterning region 212b. In this case, the main features 215 may be used to pattern control gates, floating gates, select gates, or other elements in the memory region of the memory device, and the assist features 220 are placed near the main features 215 for resolution enhancement.

The assist features 225 are placed in the non-patterning region 212b to block the radiation 112. As such, the radiation 112 can only pass through an area not occupied by the assist features 225 (e.g., spaces between the assist features 225), and the intensity of the radiation 112 passing through the photo mask 200 can be reduced and the heating problem of the lens system 150 can be improved. The assist features 225 may be sub-resolution assist features. In another word, they are of dimensions such that the features will not image onto the wafer 10 when the photo mask 200 is irradiated. Though illustrated as rectangular, the assist features 225 may include any variation of shape, size, and/or dimension. Further, the shapes, dimensions, sizes, and positions of the assist features 225 may be modified during the design and mask making process.

In some embodiments, the main features 210 and 215 have dimensions (e.g., lengths, widths, and/or diameters) all greater than a printable dimension defined as a minimum dimension printable to a photoresist layer during a lithography patterning process. For example, at least one of the main features (i.e., the device features) 215 in FIG. 3A has a length L1 and a width W1, and both the length L1 and the width W1 are greater than the printable dimension. It is noted that the main features 215 may have different dimensions (e.g., different lengths and/or different widths). Moreover, in FIG. 2, the main features (i.e., the scribe line features) 210 have a minimum dimension (the width W2 in this case) greater than the printable dimension. In some embodiments, the printable dimension can be in a range from about 25 nm to about 30 nm (or in a range from about 27 nm to about 29 nm) when the radiation 112 is 193 nm light.

In some embodiments, the assist features 220 and 225 have dimensions (e.g., lengths, widths, and/or diameters), and the minimum dimensions of the assist features 220 and 225 are less than the printable dimension. For example, at least one of the assist features 220 in FIG. 3A has a length L2 and a width W3, and at least the width W3 is less than the printable dimension. In some other embodiments, both the length L2 and the width W3 are less than the printable dimension. It is noted that the assist features 220 may have different dimensions (e.g., different lengths and/or different widths). Moreover, at least one of the assist features 225 has a length L3 and a width W4, and at least the width W4 is less than the printable dimension. In some other embodiments, both the length L3 and the width W4 are less than the printable dimension. It is noted that the assist features 225 may have different dimensions (e.g., different lengths and/or different widths).

Therefore, the width W1 of the main features 215 is greater than the width W3 of the assist features 220. Further, the width W1 of the main features 215 is greater than the width W4 of the assist features 225. Also, the width W2 of the main features 210 is greater than the width W3 of the assist features 220. Further, the width W2 of the main features 210 is greater than the width W4 of the assist features 225. In some embodiments, the width W3 of the assist features 220 is greater than the width W4 of the assist features 225. In some embodiments, the width W4 of the assist features 225 is greater than the width W3 of the assist features 220 but less than the width W1 of the main features 215 and/or the width W2 of the main features 210.

In some embodiments, a minimum distance d1 between each of the assist features 225 and the main features 215 is greater than about 1 um. For example, the minimum distance d1 is greater than about 1 um and less than a maximum dimension (length) of the exposure field 202 of the photo mask 200. For example, the minimum distance d1 is greater than about 1 um and less than about 200 mm. Stated another way, each of the assist features 225 is spaced apart from any of the main features 215 by at least 1 um. In some embodiments, the minimum distance d1 is greater than a distance d5 (see FIG. 3C for clarity) between adjacent two of the main features 215. As such, the assist features 225 are used to reduce the transparent area in the non-patterning region 212b and are not used for resolution enhancement of the main features 215. On the other hand, a distance (e.g., a distance d4) between any one of the assist features 220 and a nearest main feature 215 is less than the minimum distance d1 between each of the assist features 225 and the main features 215.

Since the assist features 220 are used to enhance resolutions of the main features 215, the positions of the assist features 220 are determined based on the shapes of the main features 215. For example, the assist features 220 are disposed near the main features 215 and may be disposed at corners and/or on sides of the main features 215. On the other hand, the assist features 225 can be randomly placed in the non-patterning region 212b as shown in FIG. 3A. Embodiments fall within the present disclosure as long as the assist features 225 are disposed in the non-patterning region 212b.

In some embodiments, minimum distances d2 (in the first direction D1) and d2' (in a second direction D2 perpendicular to the first direction D1) are defined between adjacent two of the assist features 225. In some embodiments, the minimum distance d2 (or d2') is greater than about 0.06 um and less than a width W5 of the non-patterning region 212b when the photo mask 200 is used in an immersion 193-nm lithography process. In some embodiments, the minimum distance d2 (or d2') is greater than about 0.16 um and less than the width W5 of the non-patterning region 212b when the photo mask 200 is used in a dry 193-nm lithography process. If the minimum distance d2 (or d2') is less than about 0.06 um (or 0.16 um), the adjacent two assist features 225 may be treated as a main feature by mistake and appear on the wafer 10.

In some embodiments, the exposure field 202 has an area A3, and all of the main features 210, 215 and the assist features 220, 225 occupy an area greater than about 5% of the area A3. According to different device design, the main features 210 and 215 occupy different percentages of the area A3 in the exposure field 202. In some embodiments, all of the main features 210, 215 occupy an area of about 80%-90% of the area A3. In still some embodiments, all of the main features 210, 215 occupy an area of about 40%-50% of the area A3. In yet some embodiments, all of the main features 210, 215 occupy an area of about 20%-30% of the area A3 (e.g., when the photo mask 200 is used to expose elements only in the memory region or only in the logic region of a flash memory device). Embodiments fall within the present disclosure as long as all of the main features 210, 215 occupy an area greater than about 1% of the area A3.

Figure 34A:
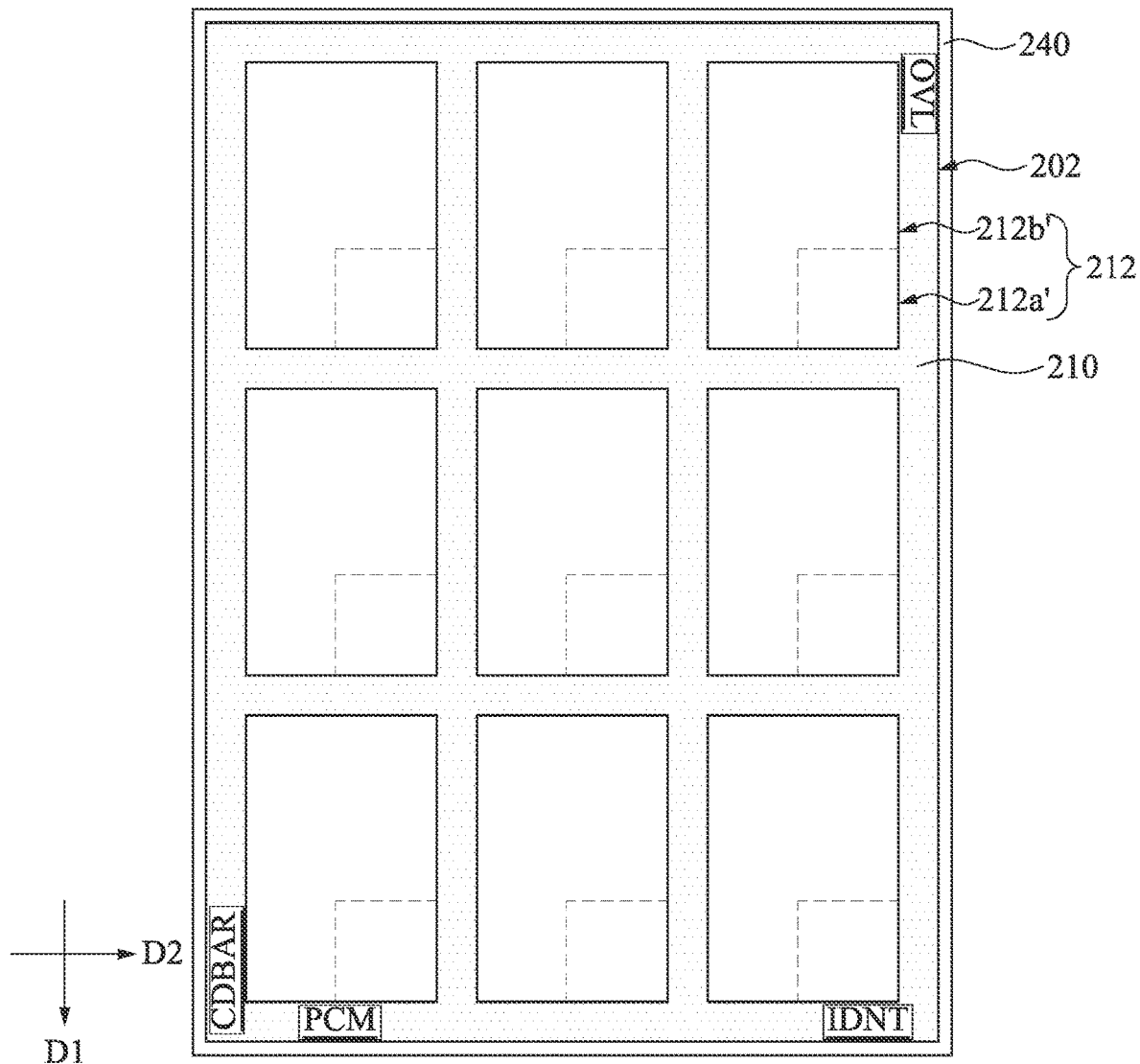
FIG. 34A illustrates a top view of the photo mask in FIG. 1 according to the present disclosure.
Figure 34B:
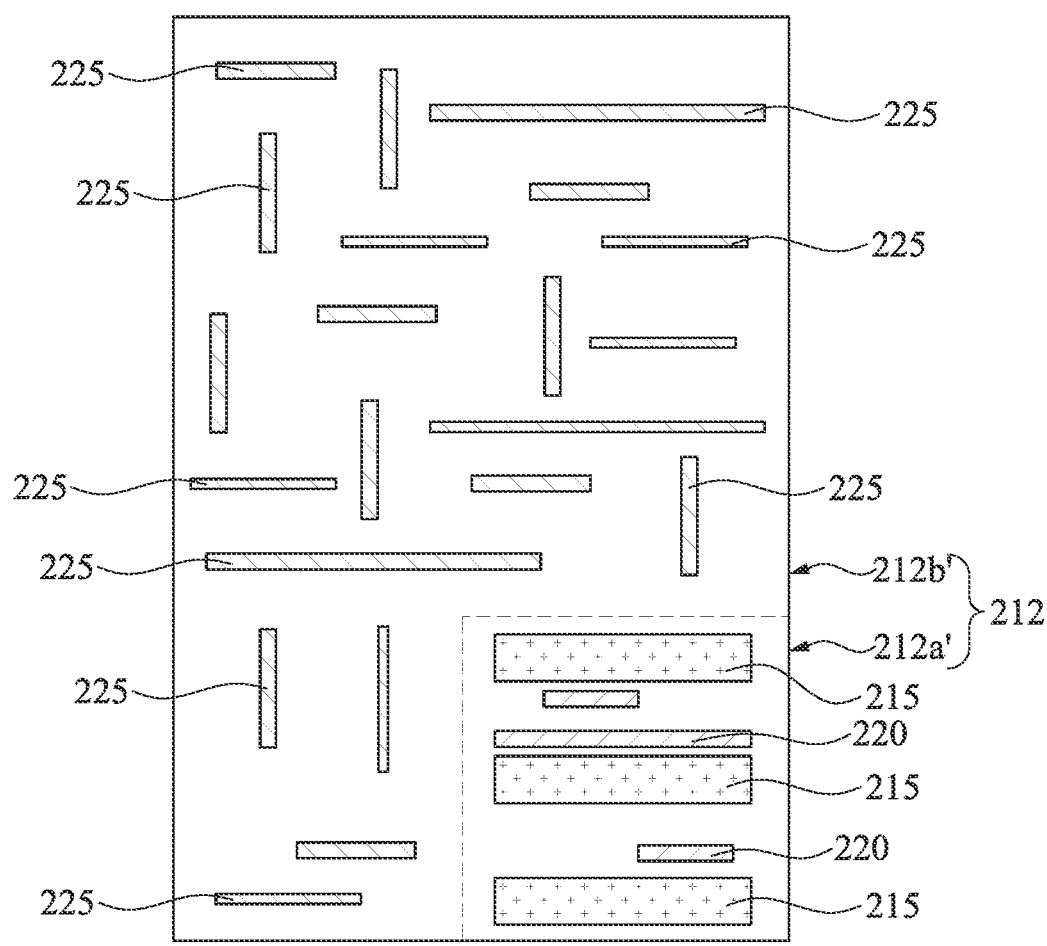
FIG. 34B is an enlarged view of one of device regions in FIG. 34A.

In some embodiments, all of the assist features 225 occupy an area greater than the area occupied by all of the main features 210, 215 (e.g., FIG. 34B). In some embodiments, the area occupied by all of the assist features 225 is about several times of the area occupied by all of the main features 210, 215. For example, the area occupied by all of the assist features 225 is about 4% of the area A3, and the area occupied by all of the main features 210, 215 is about 1% of the area A3.

Figure 3B:
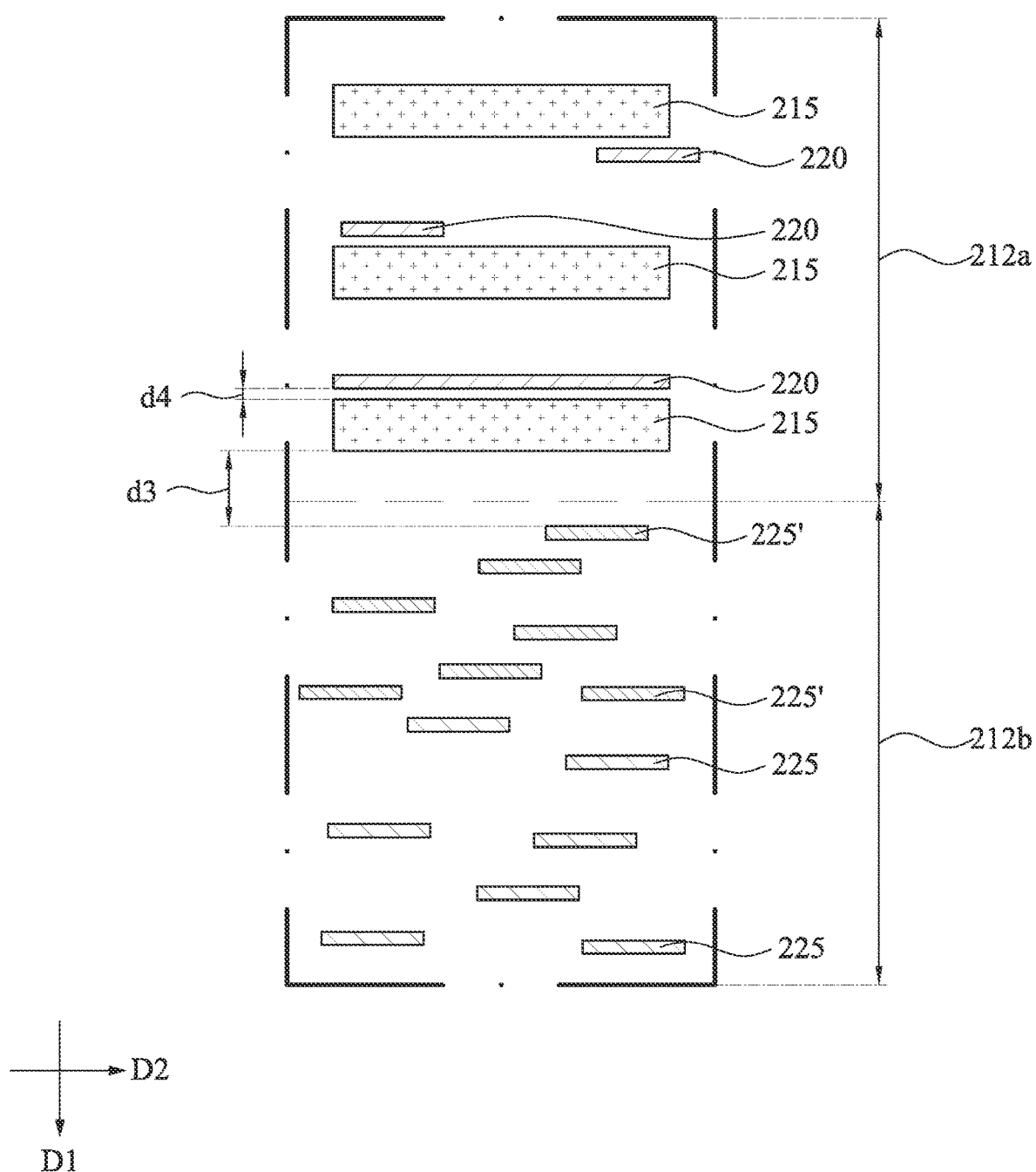
FIG. 3B-3D are enlarged views of the area P in FIG. 2 according to some other embodiments.
Figure 3C:
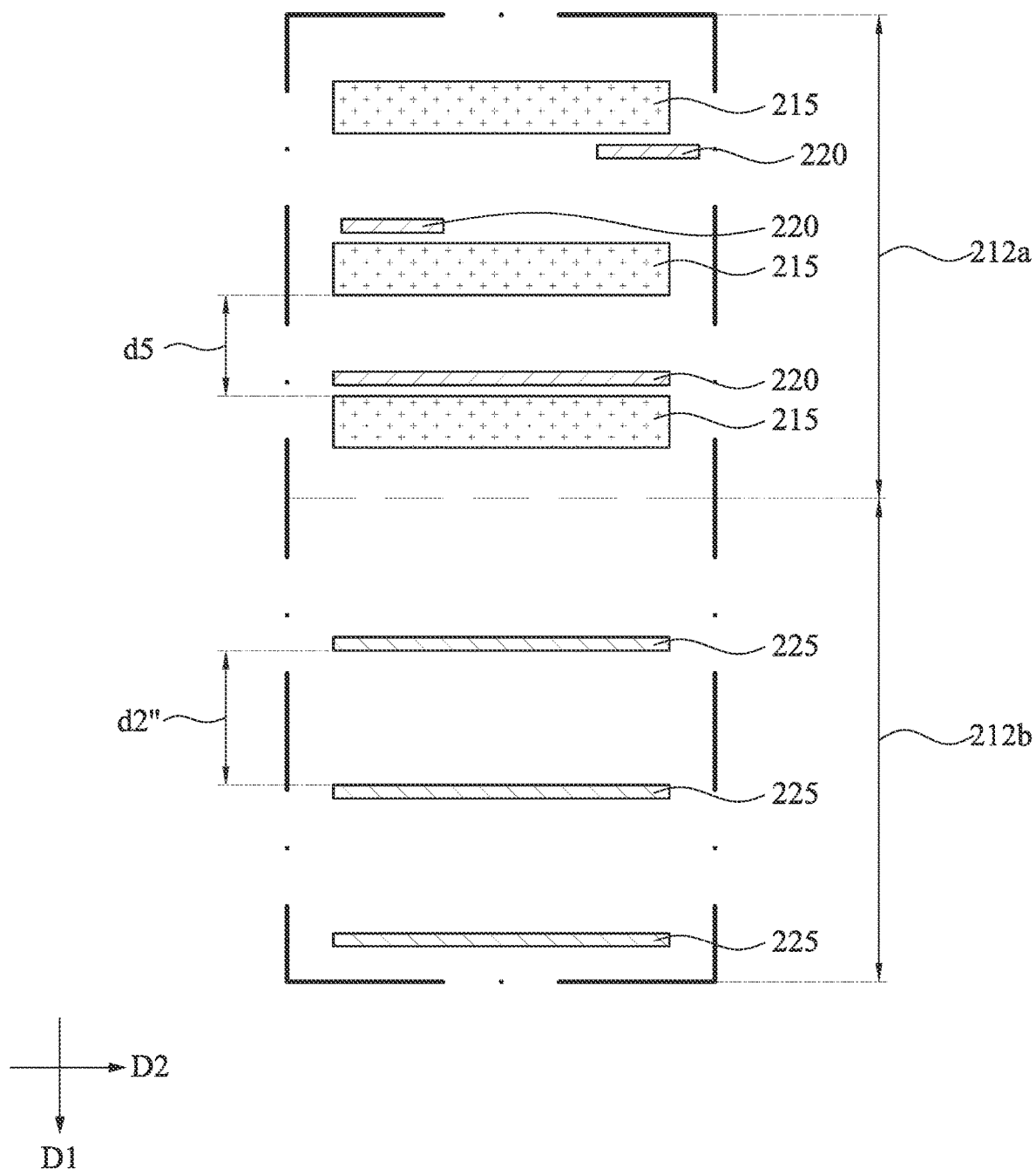
Figure 3D:
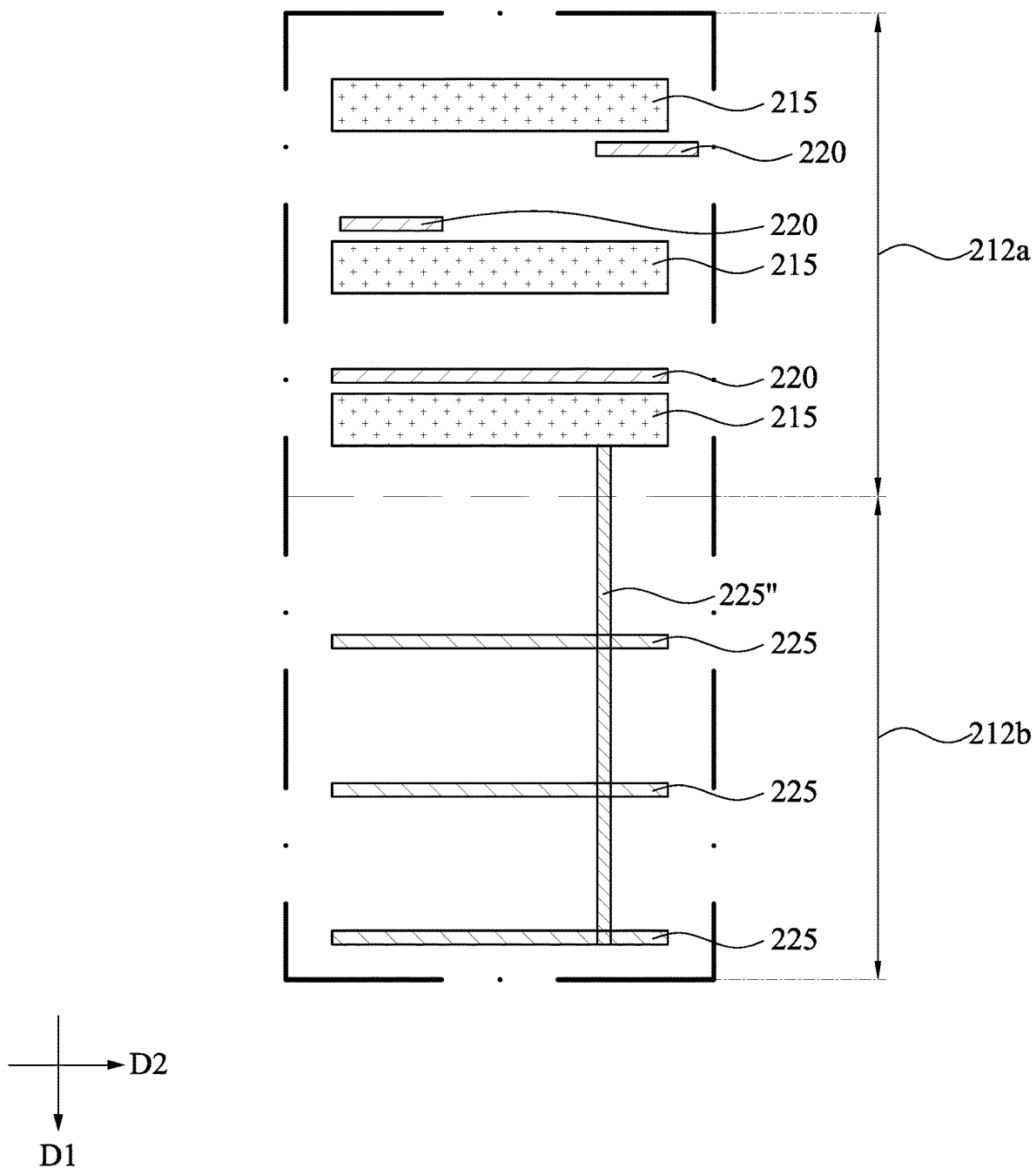

FIG. 3B-3D are enlarged views of the area P in FIG. 2 according to some other embodiments. In FIG. 3B, the photo mask 200 further includes assist features 225' between the main features 215 and the assist features 225. The shapes, profiles, dimensions of assist features 225' are similar to or substantially the same as that of the assist features 225, and, therefore, a description in this regard will not be repeated hereinafter. A minimum distance d3 between each of the assist features 225' and the main feature 215 is less than about 1 um. The assist features 225' are used to reduce the transparent area of the non-patterning region 212b and not for resolution enhancement, such that the assist features 225' are not so closed to the main features 215 as the assist features 220 do (see FIG. 3A). That is, the distance (e.g., a distance d4) between any one of the assist features 220 and a nearest main feature 215 is less than a distance (e.g., the distance d3) between any one of the assist features 225' and a nearest main feature 215.

In FIGS. 3C and 3D, the assist features 225 have shapes different from the assist features 225 in FIGS. 3A and 3B. However, the assist features 225 in FIGS. 3C and 3D have minimum dimensions less than the printable dimension. In some embodiments, the minimum distance d2" of adjacent two of the assist features 225 is greater than a minimum distance d5 of adjacent two of the main features 215, but the claimed scope of the present disclosure is not limited in this respect. In FIG. 3D, the photo mask 200 further includes at least one assist feature 225" interconnecting at least one of the main features 215 and at least one assist features 225. For example, the assist feature 225" extends in the first direction D1, and the main features 215 and the assist features 225 extend in the second direction D2. It is noted that the extension directions of all of the main features 215 and the assist features 220, 225, 225', and 225" in FIGS. 3A-3D are illustrative, and should not limit the claimed scope of the present disclosure.

Figure 4A:
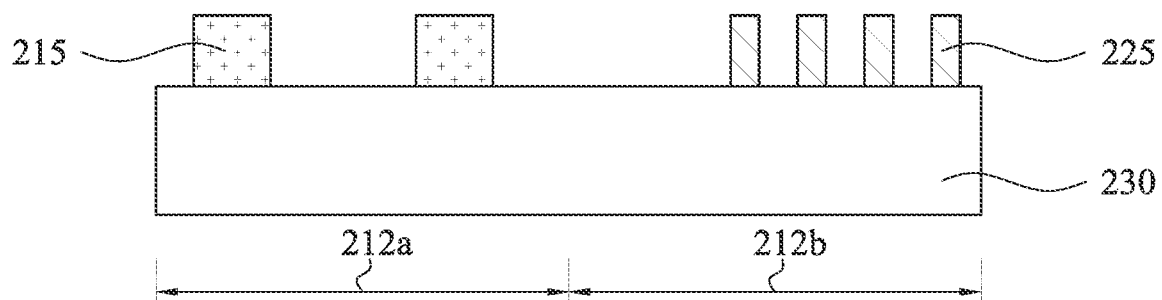
FIGS. 4A-4C are cross-sectional views of the photo mask taken along line A-A of FIG. 2.
Figure 4B:
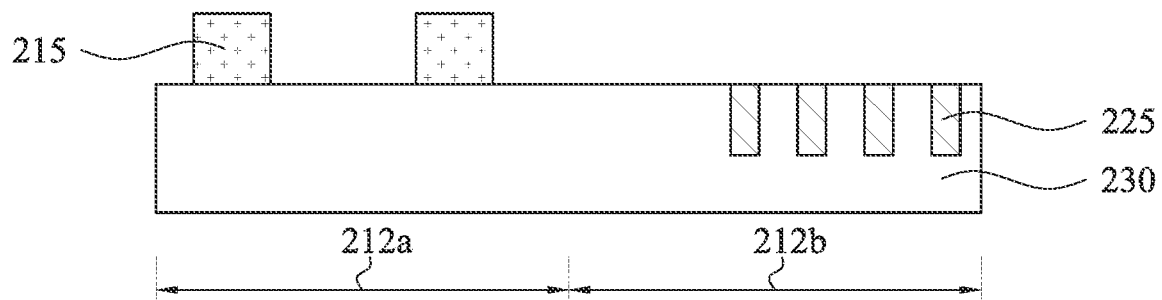
Figure 4C:
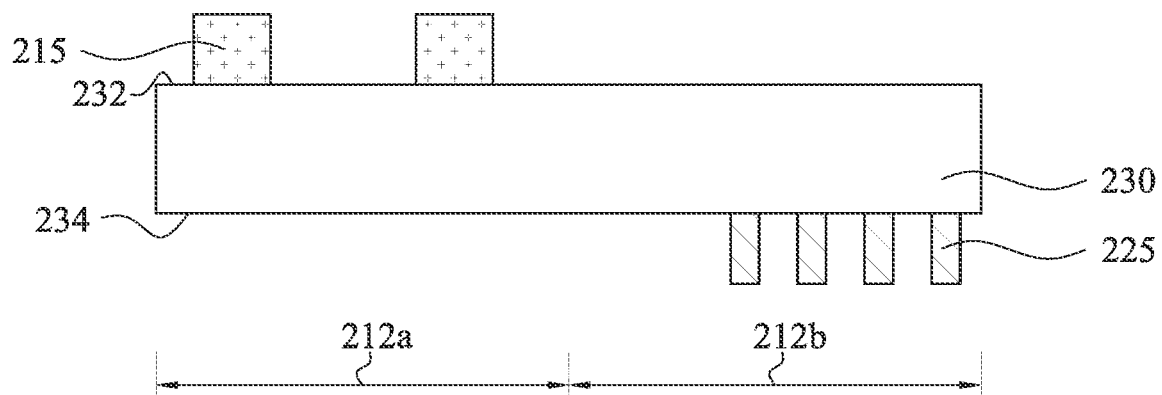

FIGS. 4A-4C are cross-sectional views of the photo mask 200 taken along line A-A of FIG. 2. In FIG. 4A, the main features 215 (and the main features 210 of FIG. 2) and the assist features 225 (and the assist features 220, 225', 225" in FIGS. 3A-3D) may be formed of attenuating material disposed on the substrate 230. The attenuating material may include chrome or other materials such as, for example, Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$, ZrN, $Al_2O_3$, or combinations thereof. The main features 210, 215 and the assist features 220, 225, 225', and 225" may be formed using processes including photoresist deposition, soft baking, mask aligning, exposing (e.g., patterning), baking, developing the photoresist, hard baking, stripping the resist, and/or other processes. In alternative embodiments, the lithography patterning may include electron-beam writing, ion-beam writing, mask-less lithography, and/or molecular imprint. Though illustrated as a symmetrical and square feature, the main features 210, 215 and the assist features 220, 225, 225', and 225" may be of any shape, size, or dimension.

In some other embodiments, as shown in FIG. 4B, at least the assist features 225 (225', 225") are embedded in the substrate 230 while the main features 215 (and 210 and the assist features 220) are disposed on the substrate 230. In some other embodiments, as shown in FIG. 4C, at least the assist features 225 (225', 225") are disposed on a backside 234 of the substrate 230 while the main features 215 (and 210 and the assist features 220) are disposed on a front-side 232 of the substrate 230.

Figure 5:
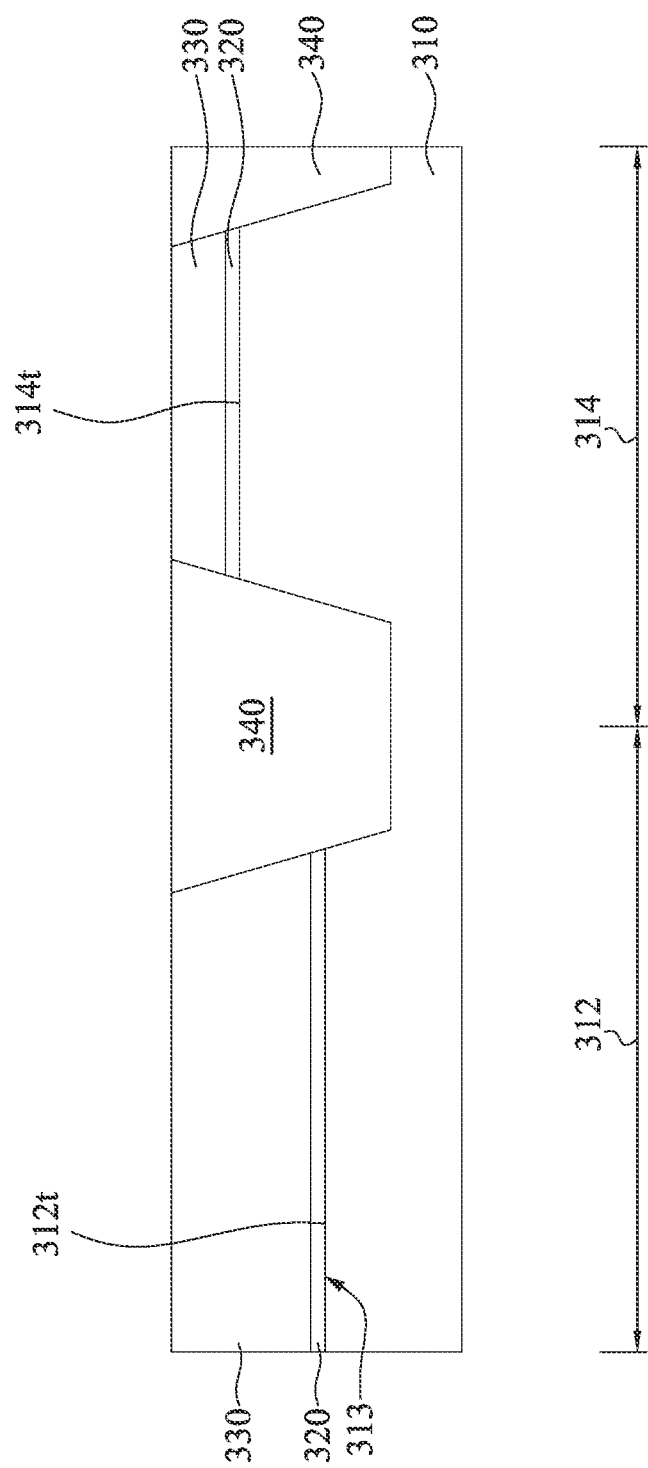
FIGS. 5 to 20 illustrate a method for manufacturing a (flash) memory device in different stages in accordance with some embodiments.

FIGS. 5 to 20 illustrate a method for manufacturing a (flash) memory device in different stages in accordance with some embodiments. It is understood that additional operations can be provided before, during, and after processes shown by FIGS. 5 to 20, and some of the operations described below can be replaced or eliminated, for additional embodiments of the method. The order of the operations/processes may be interchangeable. Reference is made to FIG. 5. A substrate 310 is provided. In some embodiments, the substrate 310 can be a semiconductor substrate, such as a bulk silicon substrate, a germanium substrate, a compound semiconductor substrate, or other suitable substrate. The substrate 310 may include an epitaxial layer overlying a bulk semiconductor, a silicon germanium layer overlying a bulk silicon, a silicon layer overlying a bulk silicon germanium, or a semiconductor-on-insulator (SOI) structure. The substrate 310 includes a memory region 312 and a logic region 314. The logic region 314 is located at least one edge of the memory region 312. An area of the logic region 314 may be greater than, equal to, or less than an area of the memory region 312.

The memory region 312 of the substrate 310 is then recessed (such as etched). Therefore, a recess 313 is formed in the memory region 312 of the substrate 310. A top surface 312t of the memory region 312 is lower than a top surface 314t of the logic region 314.

A pad layer 320 is then formed over the substrate 310. The pad layer 320 may be formed of dielectric material, such as an oxide layer. A mask layer 330 is formed over the pad layer 320. In some embodiments, the mask layer 330 is formed of dielectric material, such as silicon nitride (SiN) or other suitable materials. Subsequently, a plurality of isolation structures 340 are formed in the substrate 310. In greater detail, a plurality of trenches are formed in the substrate 310, and dielectric material covers the substrate 310, the pad layer 320, and the mask layer 330. In some embodiments, the dielectric material includes oxide and/or other dielectric materials. Optionally, a liner oxide (not shown) may be formed in advance. In some embodiments, the liner oxide may be a thermal oxide. In some other embodiments, the liner oxide may be formed using in-situ steam generation (ISSG). In yet some other embodiments, the liner oxide may be formed using selective area chemical vapor deposition (SACVD) or other commonly used CVD methods. The formation of the liner oxide reduces the electrical fields and hence improves the performance of the resulting semiconductor device. A chemical mechanical polish (CMP) is then performed to level the top surface of the dielectric material to the top surfaces of the mask layer 330 to form a plurality of isolation structures 340.

Figure 6:
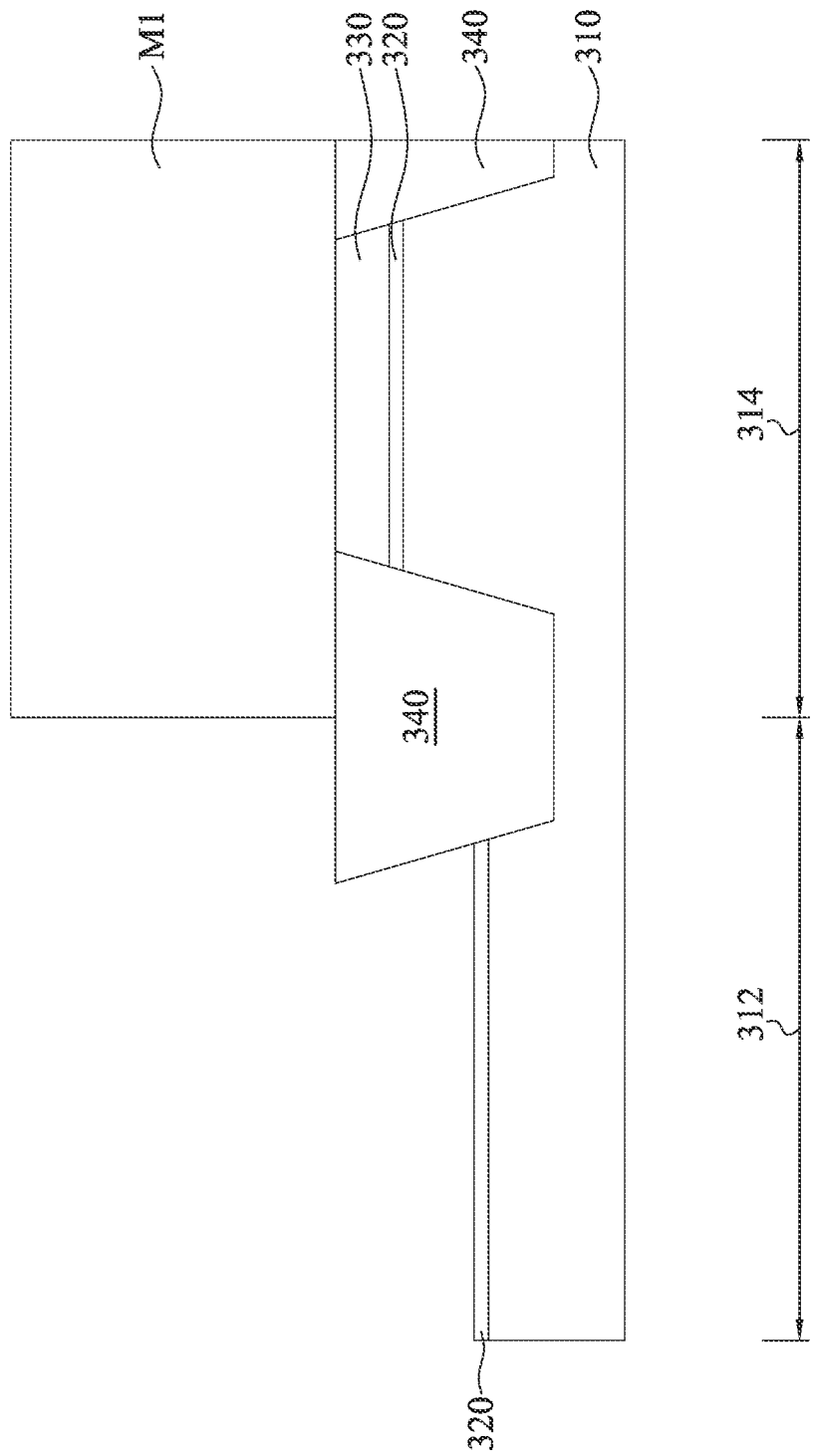

Reference is made to FIG. 6. A patterned photoresist layer M1 is formed over the logic region 314 of the substrate 310 to cover the structures disposed over the logic region 314 of the substrate 310 and expose the structures disposed over the memory region 312 of the substrate 310. A portion of the mask layer 330 (see FIG. 5) over the memory region 312 is then removed. As such, a portion of the pad layer 320 over the memory region 312 is exposed, and this portion of the pad layer 320 can be referred to as a tunneling film.

Figure 7:
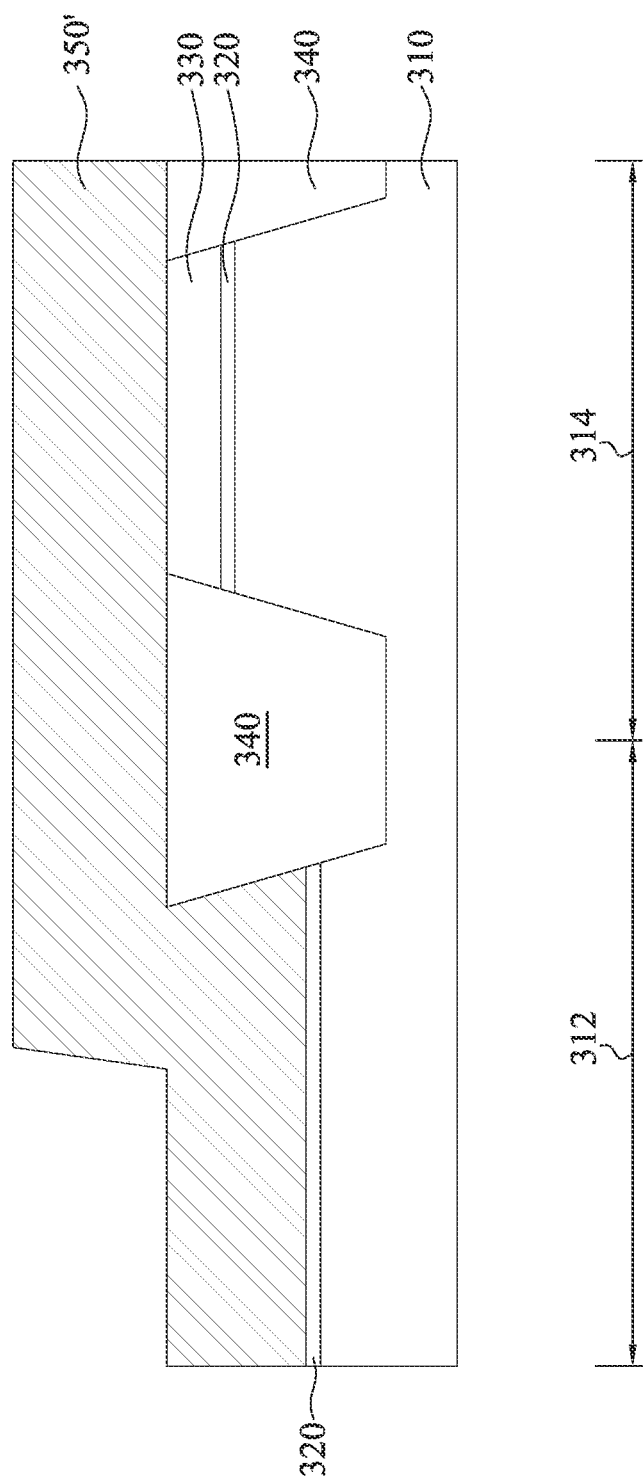

Reference is made to FIG. 7. The patterned photoresist layer M1 (see FIG. 6) is then removed, and the removal method may be performed by solvent stripping or plasma ashing, for example. A floating gate material 350' is conformally formed over the substrate 310. The floating gate material 350' may include polysilicon formed through, for example low pressure CVD (LPCVD) methods, CVD methods and PVD sputtering methods employing suitable silicon source materials. If desired, the floating gate material 350' may be ion implanted to the desired conductive type. It is to be appreciated other gate electrode material such as metal, metal alloys, single crystalline silicon, or combinations thereof.

Figure 8:
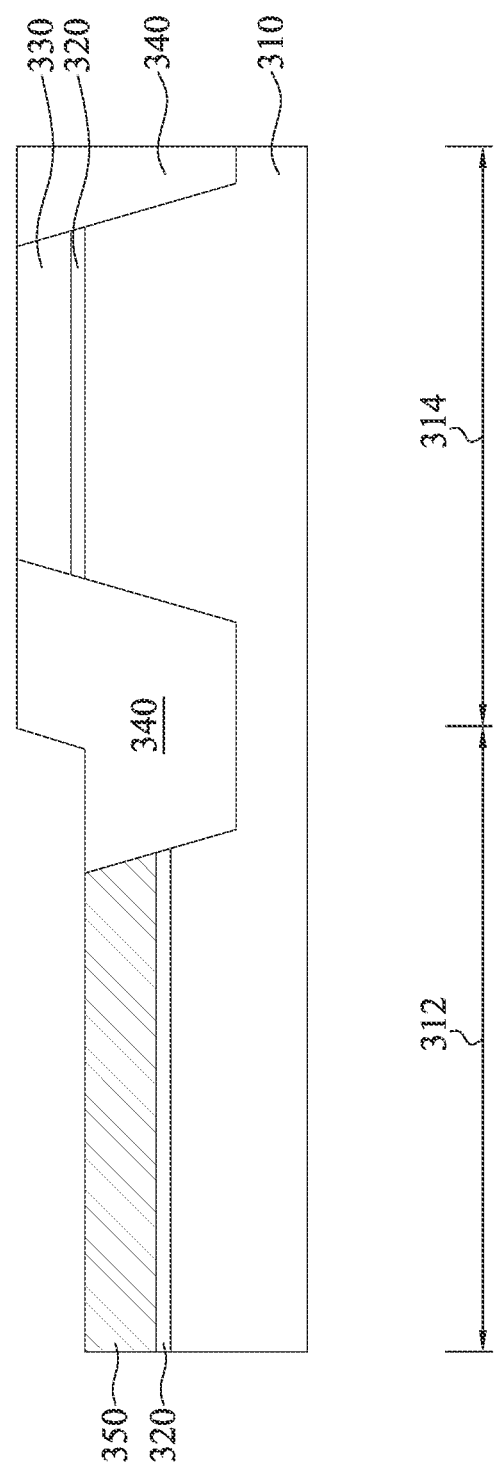

Reference is made to FIG. 8. The floating gate material 350' in FIG. 7 is patterned to be a floating gate layer 350 over the memory region 312. In some embodiments, a planarization process includes a chemical mechanical planarization (CMP) process is performed to remove a portion of the floating gate material 350' until top surfaces of the isolation structures 340 are exposed, and an etching back process is then performed to remove another portion of the floating gate material 350' until the remaining floating gate layer 350 has a desired thickness. In some embodiments, a portion of the isolation structure 340 is also removed in the etching back process as shown in FIG. 8.

Figure 9:
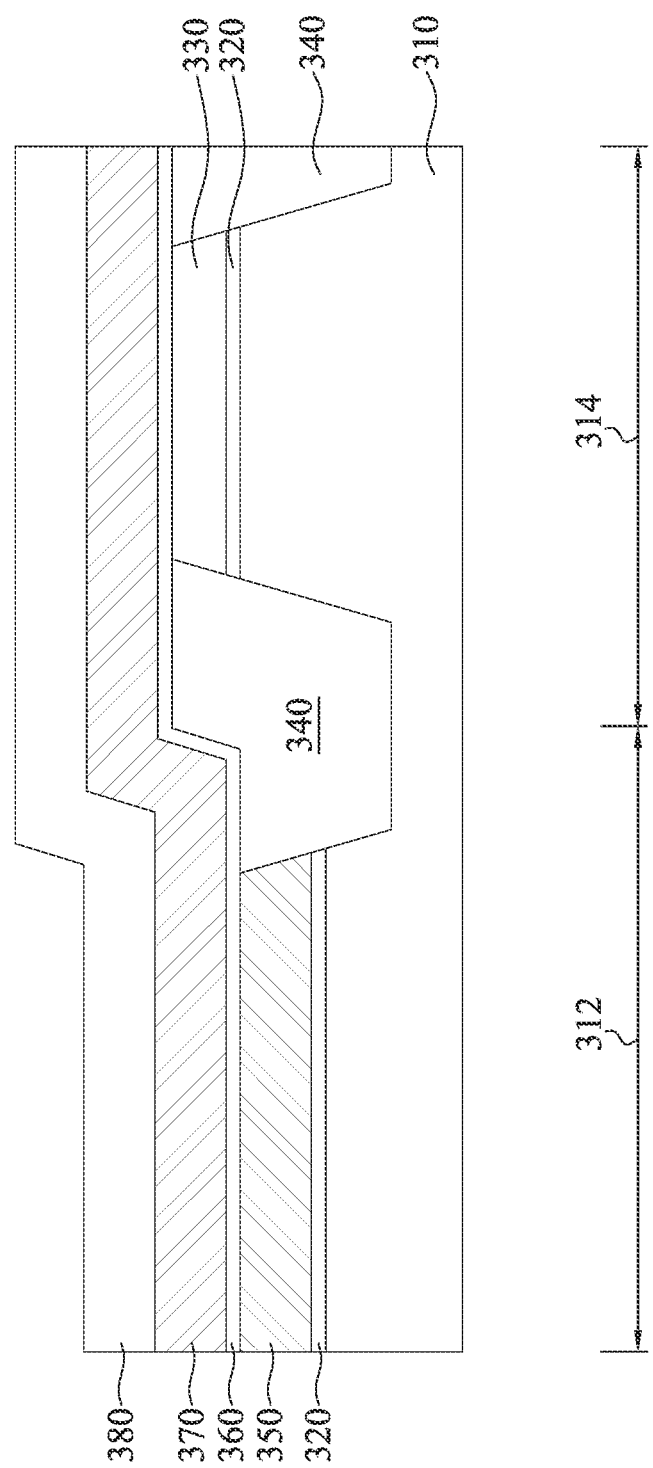

Reference is made to FIG. 9. A dielectric film 360 is conformally formed over the structure of FIG. 8. In some embodiments, the dielectric film 360 and the tunneling film 320 may have the same or different materials. The dielectric film 360 may include, for example, a dielectric material such as silicon dioxide ($SiO_2$), silicon nitride ($Si_3N_4$), silicon oxynitrides (SiON), high-k materials, other non-conductive materials, or combinations thereof. In some embodiments, the dielectric film 360 has an oxide-nitride-oxide (ONO) structure including an oxide layer, a nitride layer over the oxide layer, and additional oxide layer over the nitride layer. The dielectric film 360 may be formed using chemical vapor deposition (CVD), physical vapor deposition (PVD), atomic layer deposition (ALD), ozone oxidation, other suitable processes, or combinations thereof.

A control gate film 370 is then conformally formed over the dielectric film 360. The control gate film 370 may include polysilicon formed through, for example low pressure CVD (LPCVD) methods, CVD methods and PVD sputtering methods employing suitable silicon source materials. If desired, the control gate film 370 may be ion implanted to the desired conductive type. It is to be appreciated other gate electrode material such as metal, metal alloys, single crystalline silicon, or combinations thereof.

A hard mask layer 380 is conformally formed over the control gate film 370. The hard mask layer 380 may include single layer or multiple layers. In some embodiments, the hard mask layer 380 includes $SiN/SiO_2/SiN$ stacked layers or other suitable materials. In some embodiments, the hard mask layer 380 may be formed using chemical vapor deposition (CVD), physical vapor deposition (PVD), atomic layer deposition (ALD), ozone oxidation, other suitable processes, or combinations thereof.

Figure 10:
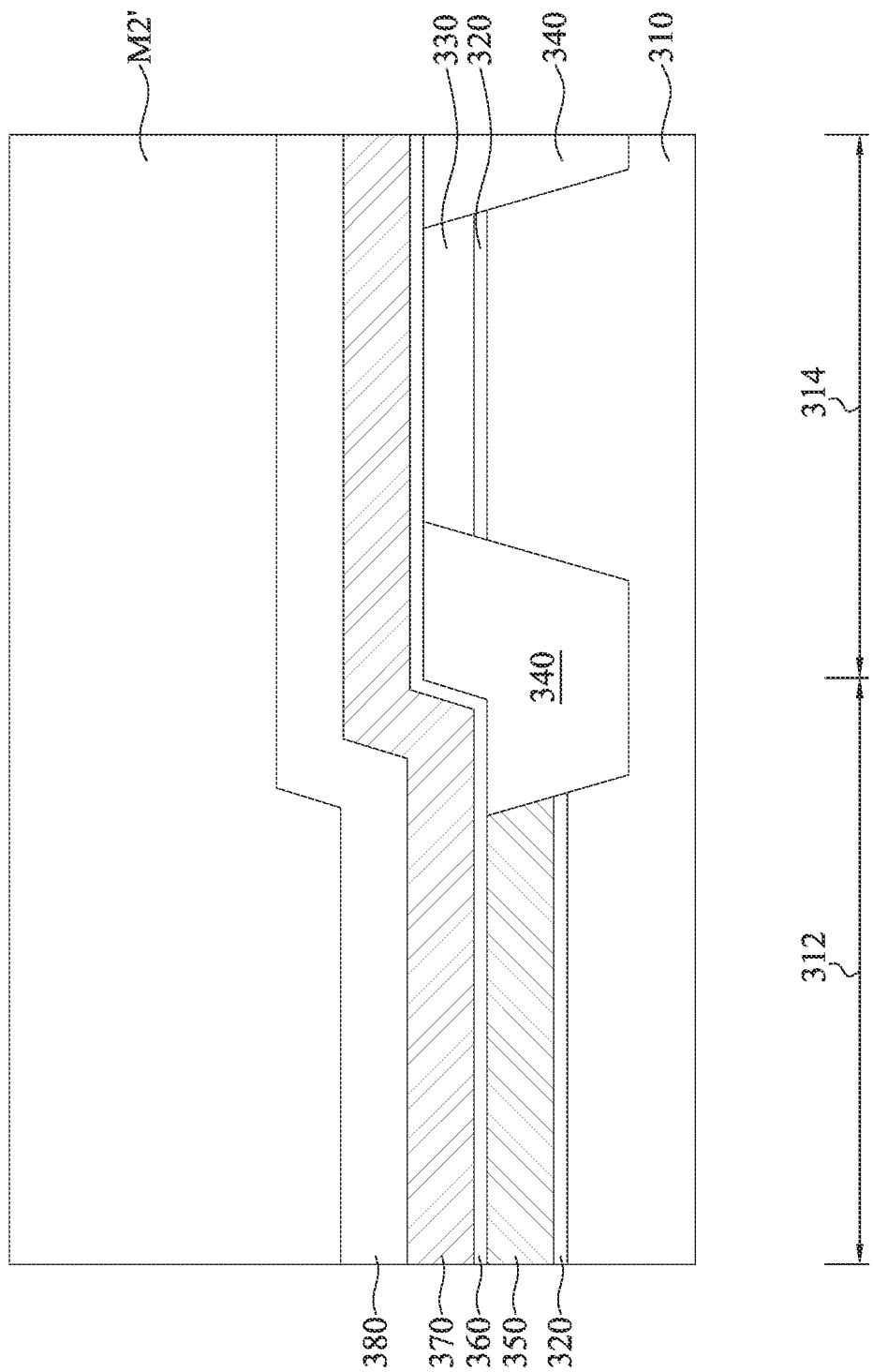
Figure 11:
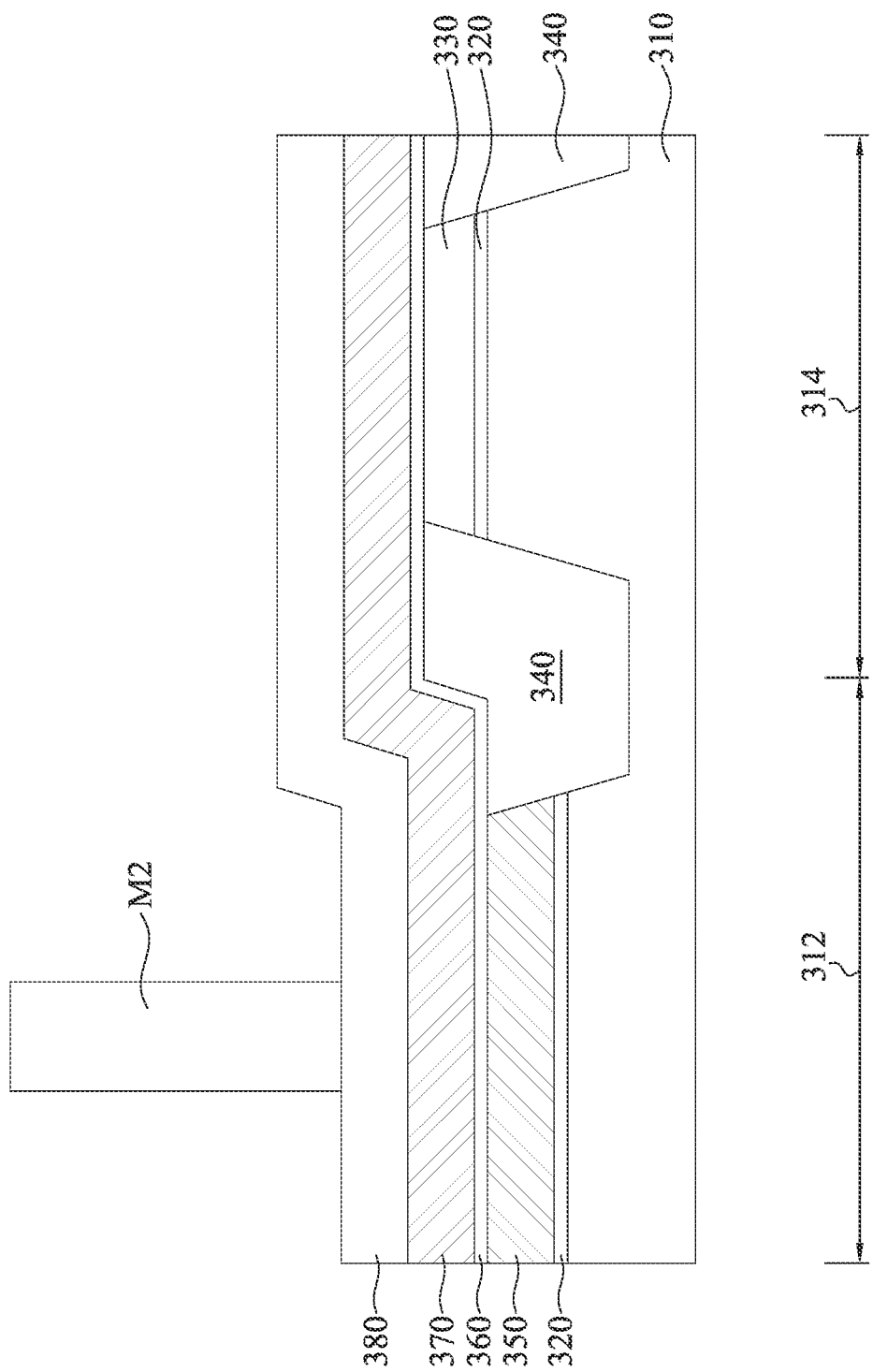

Reference is made to FIGS. 10 and 11. A patterned photoresist layer M2 is formed over the memory region 312 of the substrate 310 and exposes the logic region 314 of the substrate 310. For example, the patterned photoresist layer M2 is formed by a combination of spin coating, exposing and developing processes. Specifically, a photoresist layer M2' is formed over the structure of FIG. 9, and a patterning process is performed using a photo mask to remove at least a portion of the photoresist layer M2', such that the patterned photoresist layer M2 is formed as shown in FIG. 11. That is, the patterned photoresist layer M2 is formed over the memory region 312 of the substrate 310 and not over the logic region 314 of the substrate 310.

For example, the structure of FIG. 10 can be disposed on the wafer stage 120 of FIG. 1, and a photo mask is disposed on the reticle holder 130. The light source 110 then provides the radiation 112 to the photo mask to expose the photoresist layer M2'. The exposed photoresist layer M2' is then baked, developed, and hard baked to form the patterned photoresist layer M2 of FIG. 11.

Figure 33:
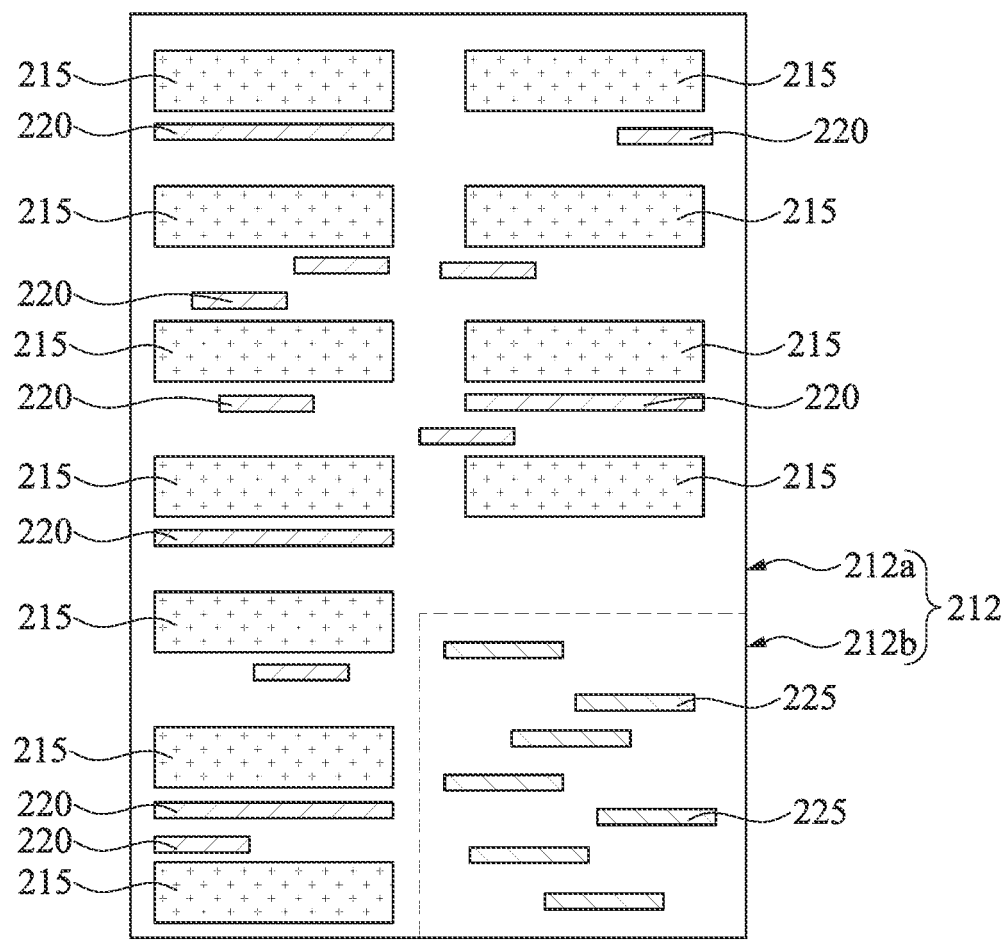
FIG. 33 is an enlarged view of one of the device regions in FIG. 2.

In some embodiments, the photo mask used to pattern the photoresist layer M2' can be shown in FIG. 2, and FIG. 33 is an enlarged view of one of the device regions 212 in FIG. 2. Reference is made to FIGS. 11 and 33. The device region 212 of the photo mask 200 includes the patterning region 212a and the non-patterning region 212b. The patterning region 212a corresponds to the memory region 312 of the substrate 310, and the non-patterning region 212b corresponds to the logic region 314 of the substrate 310. That is, a portion of the radiation 112 (see FIG. 1) passes through the patterning region 212a is incident on the memory region 312 of the substrate 310, and another portion of the radiation 112 passes through the non-patterning region 212b is incident on the logic region 314 of the substrate 310. The main features 215 and the assist features 220 are in the patterning region 212a, and the assist features 225 are in the non-patterning region 212b. Though illustrated as rectangular, the main features 215 and the assist features 220 and 225 may include any variation of shape, size, and/or dimension. Further, the shapes, dimensions, sizes, and positions of the main features 215 and the assist features 220 and 225 may be modified during the design and mask making process.

The main features 215 in FIG. 33 are used to pattern the photoresist layer M2' in FIG. 10, and the profiles of the patterned photoresist layer M2 corresponds to the main features 215. The assist features 220 are disposed near the main features 215 for resolution enhancement. The assist features 225 are disposed in the non-patterning region 212b to reduce the intensity of the radiation incident on the logic region 314. The shapes, dimensions, sizes, and positions of the main features 210 and 215 and the assist features 220 and 225 in FIG. 33 are substantially the same or similar to that shown in FIGS. 2-4C, and, therefore, a description in this regard will not be repeated hereinafter.

Figure 12:
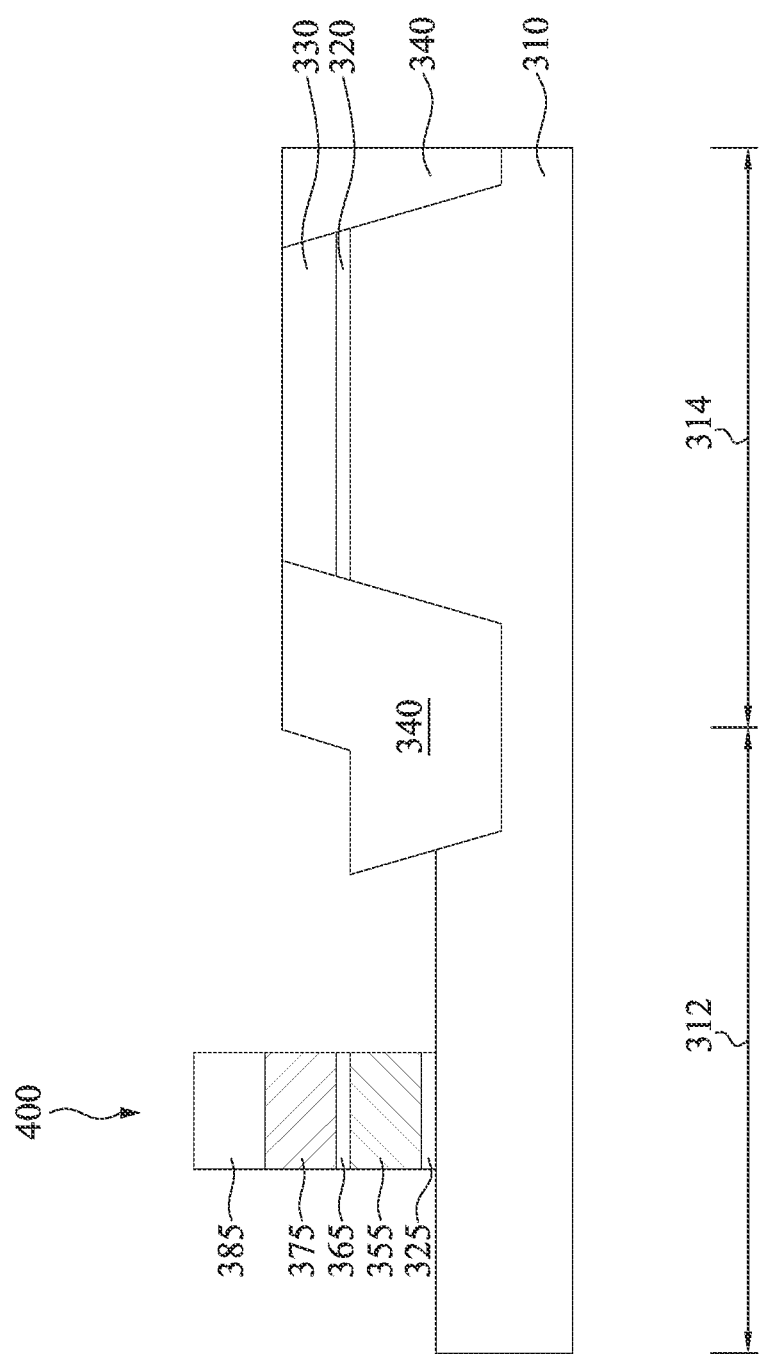

Reference is made to FIG. 12. The hard mask layer 380, the control gate film 370, the dielectric film 360, the floating gate layer 350, and the tunneling film 320 in FIG. 11 are patterned to form at least one gate stack 400 over the memory region 312 of the substrate 310. The gate stack 400 includes a tunneling layer 325, a floating gate 355, a dielectric layer 365, a control gate 375, and a hard mask 385. The tunneling layer 325 is formed from the tunneling film 320 of FIG. 11. For example, the tunneling film 320 can be patterned to form the tunneling layers 325. The floating gate 355 is formed over the tunneling layer 325 and is formed from the floating gate layer 350 of FIG. 11. For example, the floating gate layer 350 can be patterned to form the floating gates 355. The dielectric layer 365 is formed over the floating gate 355. For example, the dielectric film 360 can be patterned to form the dielectric layers 365. The control gate 375 is formed over the dielectric layer 365. For example, the control gate film 370 can be patterned to form the control gates 375. The hard mask 385 is formed over the control gate 375. For example, the hard mask layer 380 can be patterned to form the hard masks 385. After the patterning of the hard mask layer 380, the control gate film 370, the dielectric film 360, the floating gate layer 350, and the tunneling film 320, the patterned photoresist layer M2 (see FIG. 11) is then removed, and the removal method may be performed by solvent stripping or plasma ashing, for example.

Figure 13:
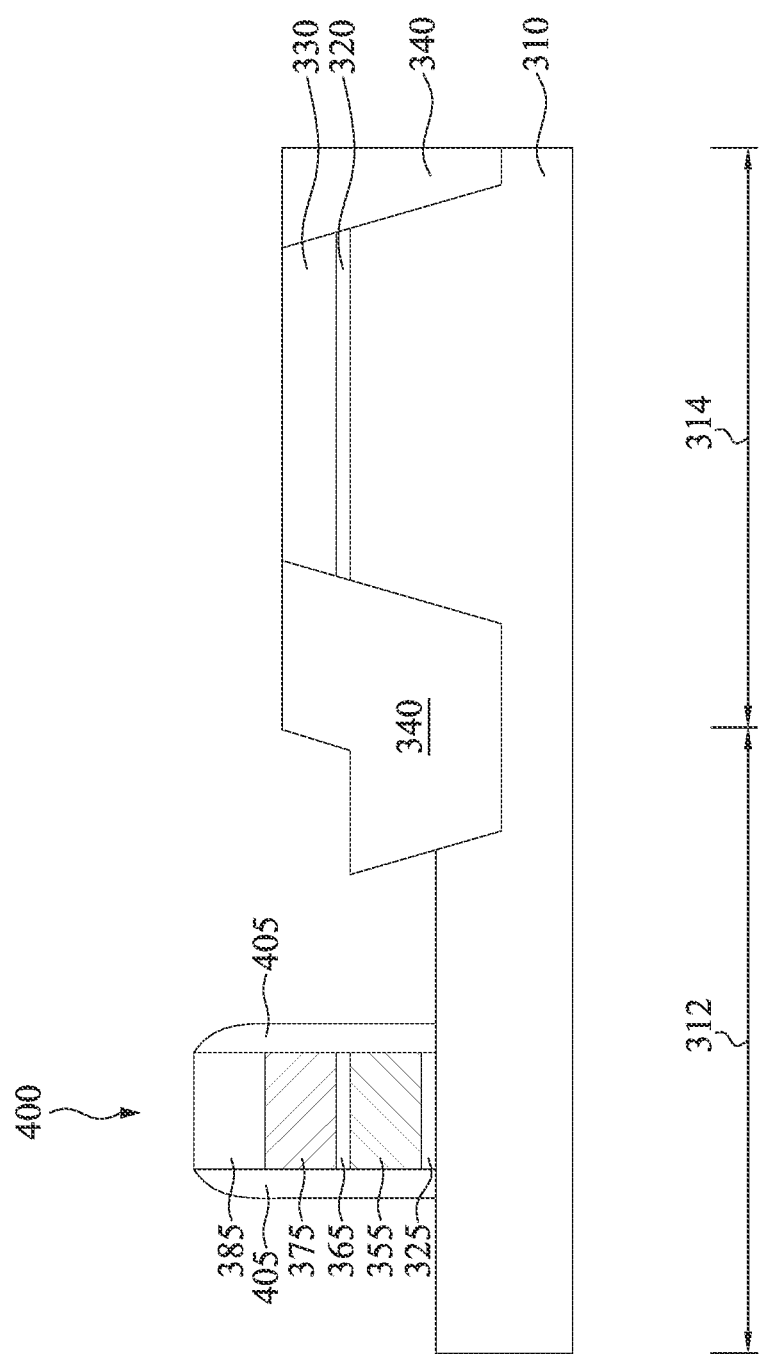

Reference is made to FIG. 13. Gate spacers 405 are formed on sidewalls of the gate stack 400. In some embodiments of the gate spacer formation operations, a spacer material layer is deposited on the substrate 310. The spacer material layer may be a conformal layer that is subsequently etched back to form the gate spacers 405. In some embodiments, the spacer material layer includes multiple layers, such as a first spacer layer and a second spacer layer formed over the first spacer layer. The first and second spacer layers each are made of a suitable material such as silicon oxide, silicon nitride, silicon carbide, silicon oxynitride, SiCN, silicon oxycarbide, SiOCN, and/or combinations thereof. By way of example and not limitation, the first and second spacer layers may be formed by depositing in sequence two different dielectric materials over the gate stack 400 using processes such as, CVD process, a sub atmospheric CVD (SACVD) process, a flowable CVD process, an ALD process, a PVD process, or other suitable process. An anisotropic etching process is then performed on the deposited spacer layers to expose portions of the substrate 310 not covered by the gate stack 400. Portions of the spacer layers directly above the gate stack 400 may be removed by this anisotropic etching process. Portions of the spacer layer on sidewalls of the gate stack 400 may remain, forming gate sidewall spacers, which are denoted as the gate spacers 405, for the sake of simplicity. In some embodiments, the first spacer layer is formed of silicon oxide that has a lower dielectric constant than silicon nitride, and the second spacer layer is formed of silicon nitride that has a higher etch resistance against subsequent etching processing than silicon oxide.

Figure 14:
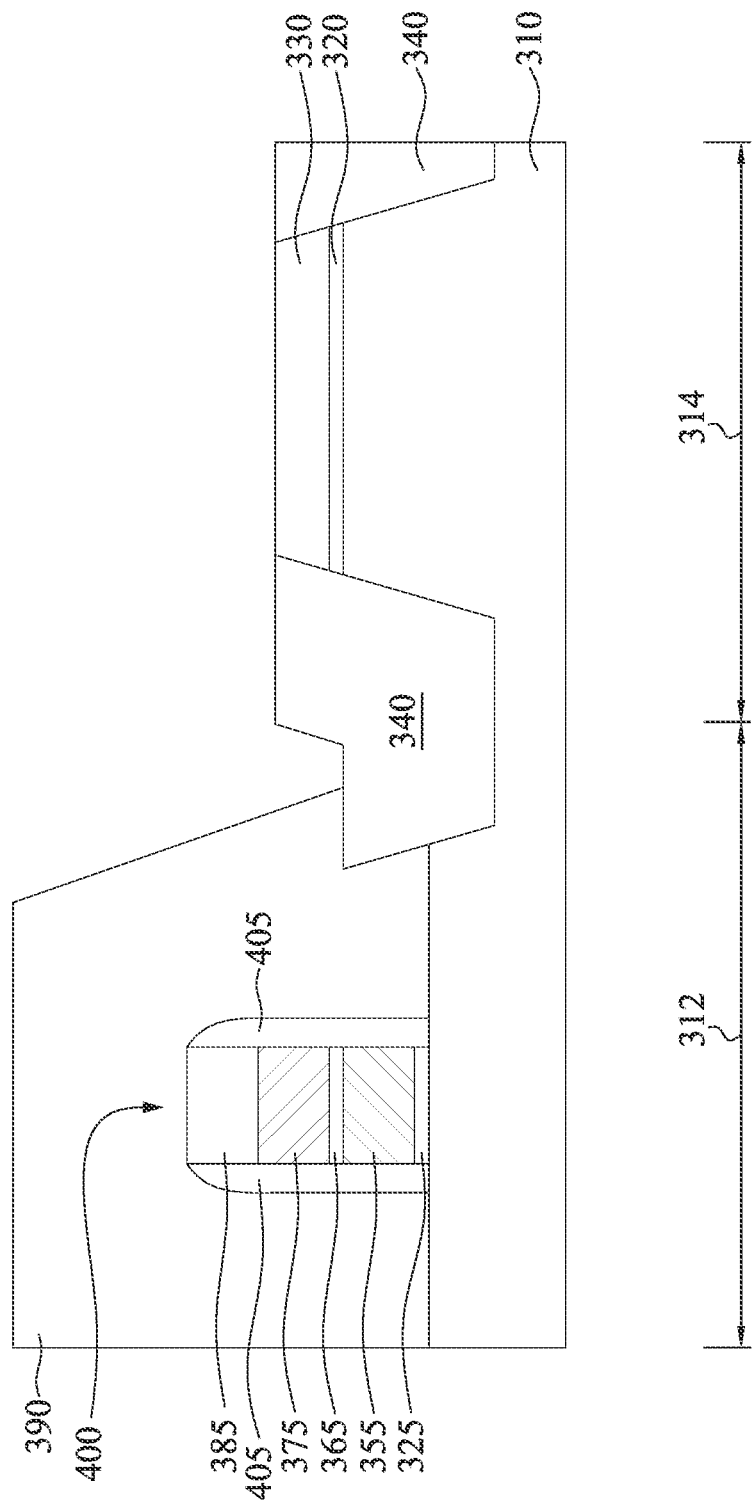

Reference is made to FIG. 14. A protection layer 390 is formed over the memory region 312 of the substrate 310, such that the protection layer 390 covers the structures formed over the substrate 310 (i.e., the gate stack 400 and the gate spacers 405). The protection layer 390 may be made of poly silicon or other suitable materials. The protection layer 390 has a tapered profile, and the protection layer 390 tapers towards the logic region 314 of the substrate 310. The protection layer 390 exposes the logic region 314, such that the protection layer 390 expose portions of the patterned mask layers 330 formed over the logic region 314.

Figure 15:
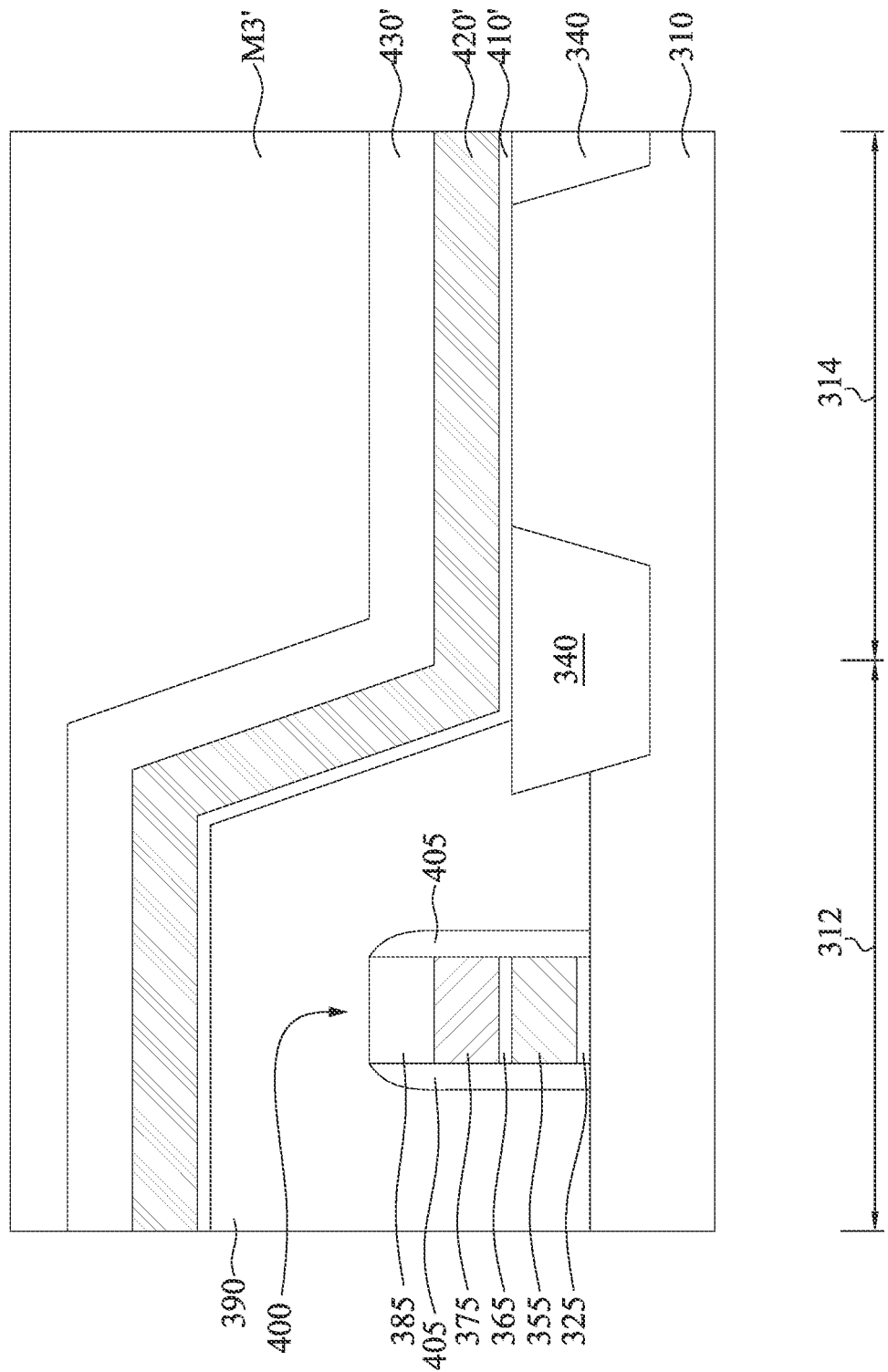

Reference is made to FIG. 15. The patterned pad layer 320 and the patterned mask layer 320 (see FIG. 14) are then removed to expose the logic region 314 of the substrate 310. Also, the isolation features 340 are etched back. A dielectric layer 410' is conformally formed over the protection layer 390 and the logic region 314 of the substrate 310. In some embodiments, the dielectric layer 410' may include silicon dioxide, silicon nitride, a high-K dielectric material, or other suitable material. In various examples, the dielectric layer 410' may be deposited by an ALD process, a CVD process, a subatmospheric CVD (SACVD) process, a flowable CVD process, a PVD process, or other suitable process. By way of example, the dielectric layer 410' may be used to prevent damage to the substrate 310 by subsequent processing (e.g., subsequent formation of the gate structure).

A gate material 420' is conformally formed over the dielectric layer 410'. The gate material 420' may include polysilicon formed through, for example low pressure CVD (LPCVD) methods, CVD methods and PVD sputtering methods employing suitable silicon source materials. It is to be appreciated other gate electrode material such as metal, metal alloys, single crystalline silicon, or combinations thereof.

A hard mask layer 430' is formed over the gate material 420'. In some embodiments, the hard mask layer 430' may be made of silicon nitride or other suitable materials. Subsequently, another photoresist layer M3' is formed over the gate material 420'.

Figure 16:
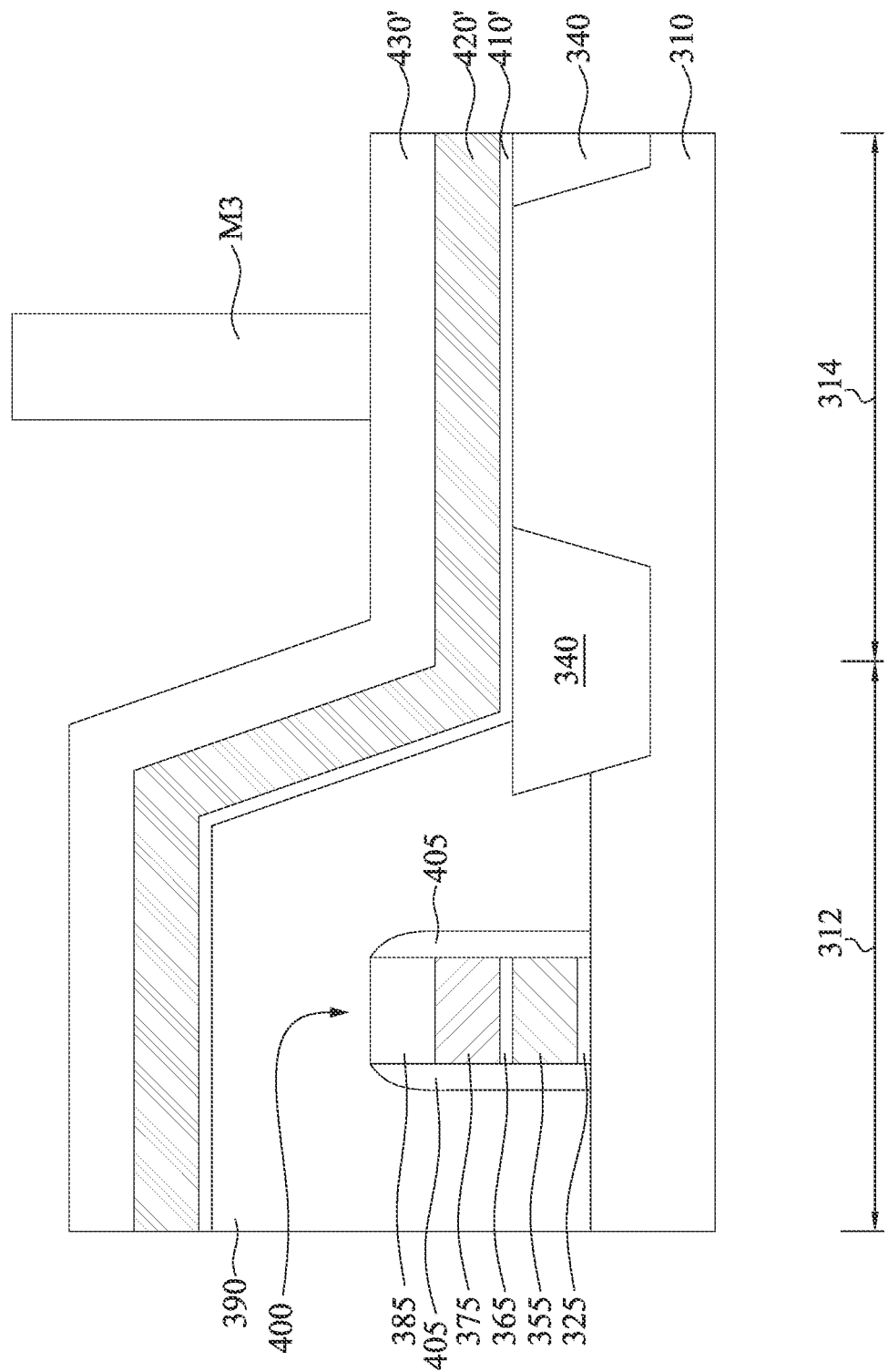

Reference is made to FIG. 16. A patterned photoresist layer M3 is formed over the logic region 314 of the substrate 310 and expose the memory region 312 of the substrate 310. For example, the patterned photoresist layer M3 is formed by a combination of spin coating, exposing and developing processes. Specifically, a patterning process is performed using a photo mask to remove at least a portion of the photoresist layer M3', such that the patterned photoresist layer M3 is formed as shown in FIG. 16. That is, the patterned photoresist layer M3 is formed over the logic region 314 of the substrate 310 and not over the memory region 312 of the substrate 310.

For example, the structure of FIG. 15 can be disposed on the wafer stage 120 of FIG. 1, and a photo mask is disposed on the reticle holder 130. The light source 110 then provides the radiation 112 to the photo mask to expose the photoresist layer M3'. The exposed photoresist layer M3' is then baked, developed, and hard baked to form the patterned photoresist layer M3 of FIG. 16.

In some embodiments, the photo mask used to pattern the photoresist layer M3' can be shown in FIG. 34A, which illustrates a top view of a photo mask 200' similar to the photo mask 200 in FIG. 1 according to the present disclosure, and FIG. 34B is an enlarged view of one of the device regions 212 in FIG. 34A. The difference between the photo mask 200' in FIG. 34A and the photo mask 200 in FIG. 2 pertains to the positions of the patterning region and the non-patterning region. In FIG. 34A, the device region 212 of the photo mask 200' includes the patterning region 212a' and the non-patterning region 212b'. The patterning region 212a' corresponds to the logic region 314 of the substrate 310, and the non-patterning region 212b' corresponds to the memory region 312 of the substrate 310. That is, a portion of the radiation 112 (see FIG. 1) passes through the patterning region 212a' is incident on the logic region 314 of the substrate 310, and another portion of the radiation 112 passes through the non-patterning region 212b' is incident on the memory region 312 of the substrate 310. The main features 215 and the assist features 220 are in the patterning region 212a', and the assist features 225 are in the non-patterning region 212b'. In this case, the main features 215 may be used to pattern gate electrode or other elements in the logic region of the memory device, and the assist features 220 are placed near the main features 215 for resolution enhancement. Though illustrated as rectangular, the main features 215 and the assist features 220 and 225 may include any variation of shape, size, and/or dimension. Further, the shapes, dimensions, sizes, and positions of the main features 215 and the assist features 220 and 225 may be modified during the design and mask making process. For example, a number of the assist features 225 is greater than a number of the main features 215. Further, all of the assist features 225 occupy an area greater than the area occupied by all of the main features 210 and 215.

Reference is made to FIGS. 16 and 34B. The main features 215 in FIG. 34B are used to pattern the photoresist layer M3' of FIG. 15, and the profiles of the patterned photoresist layer M3 corresponds to the main features 215. The assist features 220 are disposed near the main features 215 for resolution enhancement. The assist features 225 are disposed in the non-patterning region 212b' to reduce the intensity of the radiation incident on the logic region 314. The shapes, dimensions, sizes, and positions of the main features 210 and 215 and the assist features 220 and 225 in FIGS. 34A and 34B are substantially the same or similar to that shown in FIGS. 2-4C, and, therefore, a description in this regard will not be repeated hereinafter.

Figure 17:
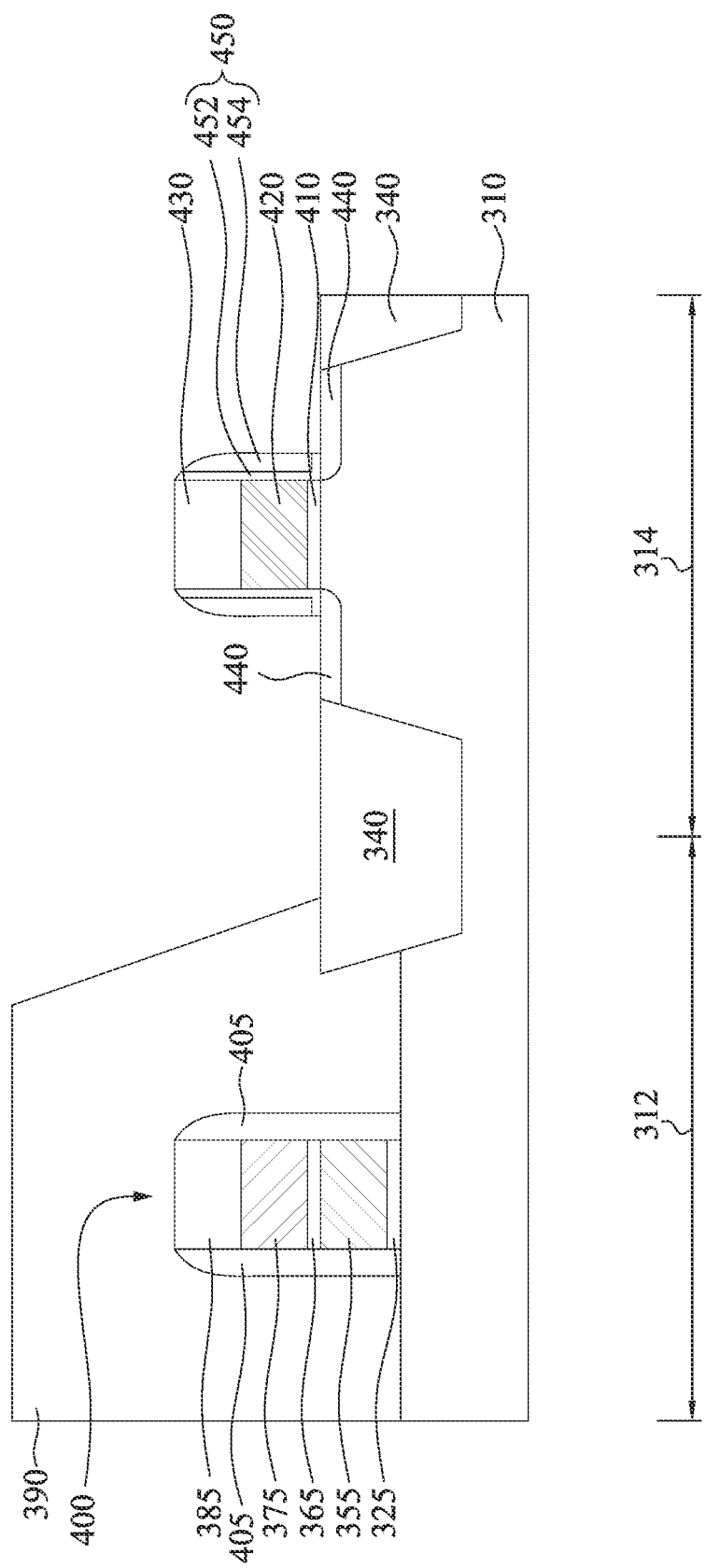

Reference is made to FIG. 17. The hard mask layer 430' of FIG. 16 is patterned to be a hard mask layer 430, the gate material 420' of FIG. 16 is patterned to be a gate structure 420, and the dielectric layer 410' of FIG. 16 is patterned to be a gate dielectric layer 410. After the patterning the of the hard mask layer 430', the patterned photoresist layer M3 (see FIG. 16) is removed by solvent stripping or plasma ashing, for example. Subsequently, an implantation is performed to introduce impurities, for example, n-type dopants such as arsenic and/or phosphorous or p-type dopants such as boron and/or boron difluoride into the logic region 314 of the substrate 310. Lightly doped source and drain (LDD) regions 440 are thus formed into the logic region 314 of the substrate 310 and on opposite sides of the gate structure 420.

Subsequently, gate spacers 450 are formed on sidewalls of the gate structure 420. In some embodiments of the gate spacer formation operations, a spacer material layer is deposited on the substrate 310. The spacer material layer may be a conformal layer that is subsequently etched back to form the gate spacers 450. In some embodiments, the spacer material layer includes multiple layers, such as a first spacer layer 452 and a second spacer layer 454 formed over the first spacer layer 452. The first spacer layer 452 and the second spacer layer 454 each are made of a suitable material such as silicon oxide, silicon nitride, silicon carbide, silicon oxynitride, SiCN, silicon oxycarbide, SiOCN, and/or combinations thereof. By way of example and not limitation, the first spacer layer 452 and the second spacer layer 454 may be formed by depositing in sequence two different dielectric materials over the gate structure 420 using processes such as, CVD process, a subatmospheric CVD (SACVD) process, a flowable CVD process, an ALD process, a PVD process, or other suitable process. An anisotropic etching process is then performed on the deposited spacer layers to expose portions of the substrate 310 not covered by the gate structure 420 and the protection layer 390. Portions of the spacer layers directly above the gate structure 420 may be removed by this anisotropic etching process. Portions of the spacer layer on sidewalls of the gate structure 420 may remain, forming gate sidewall spacers, which are denoted as the gate spacers 450, for the sake of simplicity. In some embodiments, the first spacer layer 452 is formed of silicon oxide that has a lower dielectric constant than silicon nitride, and the second spacer layer 454 is formed of silicon nitride that has a higher etch resistance against subsequent etching processing than silicon oxide.

Figure 18:
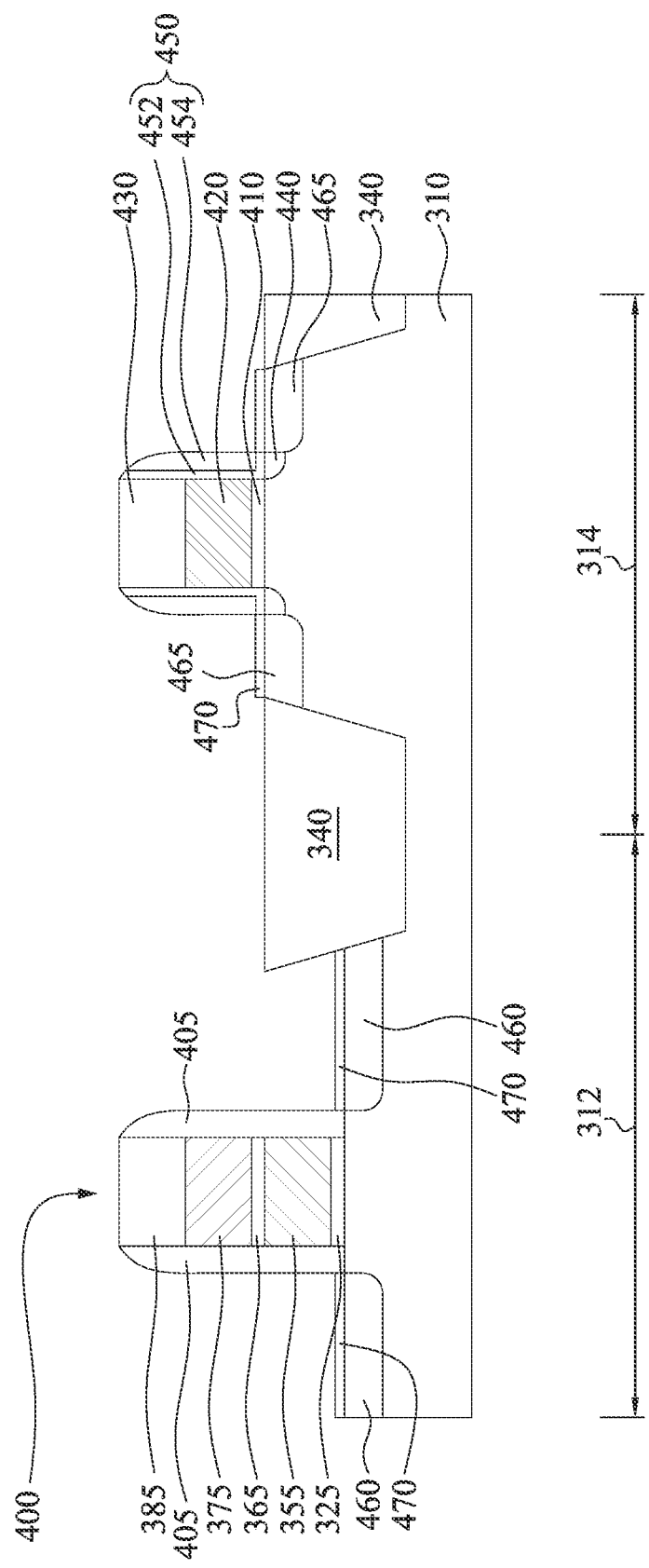

Reference is made to FIG. 18. The protection layer 390 (see FIG. 17) is removed by performing, for example, an etching process. Subsequently, source/drain features 460 are formed on opposite sides of the gate stack 400, and source/drain features 465 are formed on opposite sides of the gate structure 420. In some embodiments, the source/drain features 460 and 465 are formed by ion-implantation, diffusion techniques, or other suitable techniques. For example, an ion implantation utilizing dopants may be performed to form the source/drain features 460 and 465 in the substrate 310. In some embodiments, the source/drain features 460 and/or 465 are N-type doped regions, and the dopants implanted in the source/drain features 460 and/or 465 may be arsenic, phosphorus, or other suitable materials. In some other embodiments, the source/drain features 460 and/or 465 are P-type doped regions, and the dopants implanted in the source/drain features 460 and/or 465 may be boron, boron difluoride, or other suitable materials.

Subsequently, a plurality of metal alloy layers 470 are respectively formed over the source/drain features 460 and 465. For example, a metal layer is formed over the source/drain features 460 and 465. An annealing process is then performed on the metal layer to form the metal alloy layers 470. The annealing process is also referred to as a silicide process if the source/drain features 460 and 465 are made of silicon. The silicide process converts the surface portions of the source/drain features 460 and 465 into silicide contacts (i.e., the metal alloy layers 470 in this case). Silicide processing involves deposition of a metal material that undergoes a silicidation reaction with silicon (Si). In order to form silicide contacts on the source/drain features 460 and 465, the metal layer is blanket deposited on the exposed surfaces of the source/drain features 460 and 465. After heating the wafer to a temperature at which the metal reacts with the silicon of the source/drain features 460 and 465 to form contacts, unreacted metal is removed. The silicide contacts remain over the source/drain features 460 and 465, while unreacted metal is removed from other areas. In some embodiments, the metal alloy layers 470 may be made of NiSi or other suitable materials.

Figure 19:
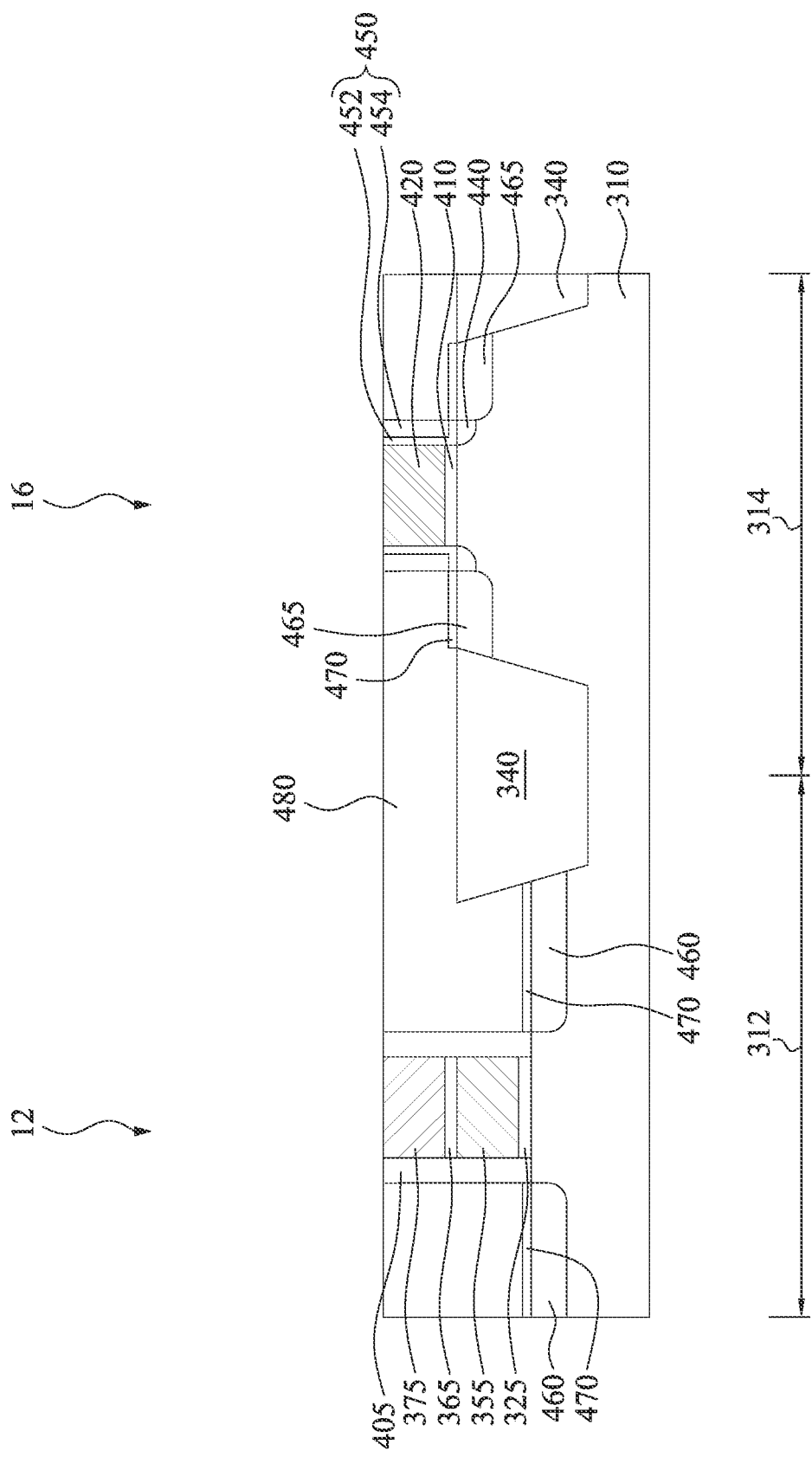

Reference is made to FIG. 19. An interlayer dielectric (ILD) layer 480 is formed over the structure of FIG. 18. In some embodiments, the ILD layer 480 is formed by chemical vapor deposition (CVD), high-density plasma CVD, spin-on, sputtering, or other suitable methods. In some embodiments, the ILD layer 480 includes silicon oxide. In some other embodiments, the ILD layer 480 may include silicon oxy-nitride, silicon nitride, or a low-k material.

In some embodiments, a contact etch stop layer (CESL) is conformally formed over the structure of FIG. 18 prior to the formation of the ILD layer 480. In some embodiments, the CESL can be a stressed layer or layers. In some embodiments, the CESL has a tensile stress and is formed of $Si_3N_4$. In some other embodiments, the CESL includes materials such as oxynitrides. In yet some other embodiments, the CESL may have a composite structure including a plurality of layers, such as a silicon nitride layer overlying a silicon oxide layer. The CESL can be formed using plasma enhanced CVD (PECVD), however, other suitable methods, such as low pressure CVD (LPCVD), atomic layer deposition (ALD), and the like, can also be used.

Subsequently, a chemical mechanical polish (CMP) process is performed to level a top surface of the ILD layer 480 (and the CESL) with a top surface of the control gate 375 and a top surface of the gate structure 420. As such, at least one memory cell 12 and at least one logic transistor 16 are formed. The memory cell 12 includes a floating gate 355, a control gate 375 over the floating gate 355, a dielectric layer 365 between the floating gate 355 and the control gate 375, and the source/drain regions 460 on opposite sides of the floating gate 355. The logic transistor 16 includes the gate structure 420 and the source/drain regions 465 on opposite sides of the gate structure 420.

Optionally, a replacement gate (RPG) process scheme is employed. In the RPG process scheme, a dummy polysilicon gate (e.g., the gate structure 420 in this case) is formed in advance and is replaced later by a metal gate. In some embodiments, the dummy gate structure 420 is removed to form an opening with the gate spacers 450 as its sidewalls. Subsequently, a metal gate structure is formed in the opening.

Figure 20:
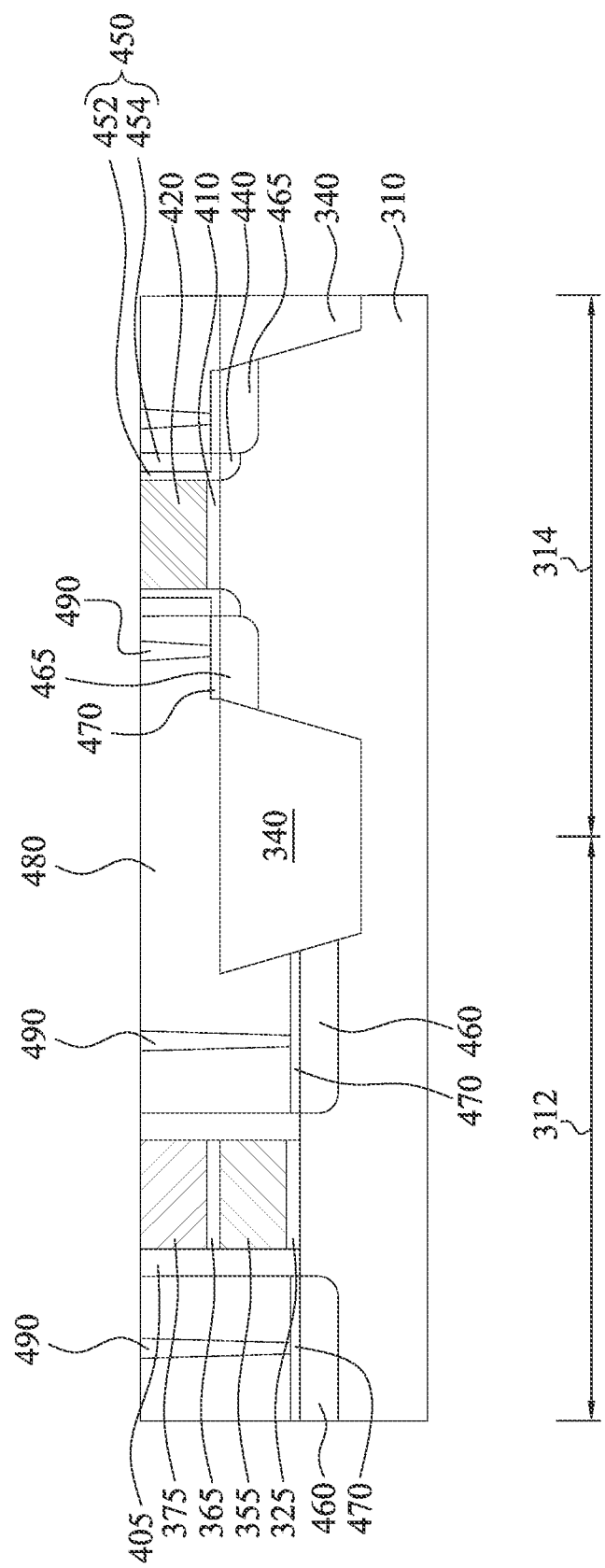

Reference is made to FIG. 20. A plurality of contacts 490 are formed over the memory cell 12 and the logic transistor 16. For example, a plurality of the openings are formed in the ILD 480, and conductive materials are filled in the openings. The excess portions of the conductive materials are removed to form the contacts 490. The contacts 490 may be made of tungsten, aluminum, copper, or other suitable materials. The contacts 490 are respectively in contact with the metal alloy layers 470.

FIGS. 21 to 32 illustrate a method for manufacturing a (flash) memory device in different stages in accordance with some embodiments. It is understood that additional operations can be provided before, during, and after processes shown by FIGS. 21 to 32, and some of the operations described below can be replaced or eliminated, for additional embodiments of the method. The order of the operations/processes may be interchangeable. The same or similar configurations, materials, processes and/or operation as described with FIGS. 5-20 may be employed in the following embodiments, and the detailed explanation may be omitted.

Figure 21:
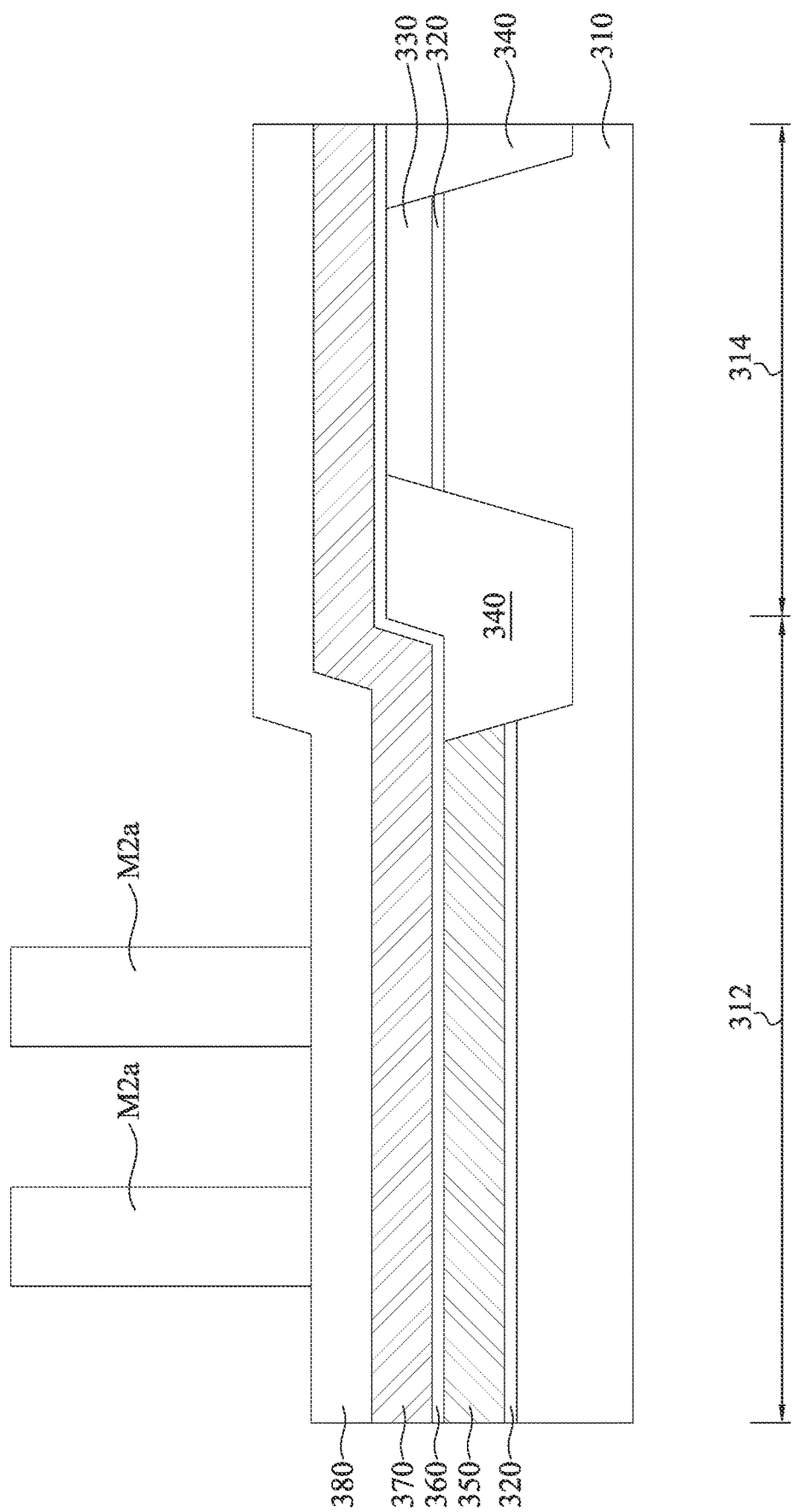
FIGS. 21 to 32 illustrate a method for manufacturing a (flash) memory device in different stages in accordance with some embodiments.

After the structure as shown in FIG. 10 is formed, a patterning process is performed using a mask to remove at least a portion of the photoresist layer M2', such that patterned photoresist layer M2a is formed as shown in FIG. 21. In some embodiments, the photo mask used to pattern the photoresist layer M2' can be shown in FIGS. 2 and 33. Since the details of the photo mask in FIGS. 2 and 33 are described above, a description in this regard will not be repeated hereinafter.

For example, the structure of FIG. 10 can be disposed on the wafer stage 120 of FIG. 1, and a photo mask is disposed on the reticle holder 130. The light source 110 then provides the radiation 112 to the photo mask to expose the photoresist layer M2'. The exposed photoresist layer M2' is then baked, developed, and hard baked to form the patterned photoresist layer M2a of FIG. 21.

Figure 22:
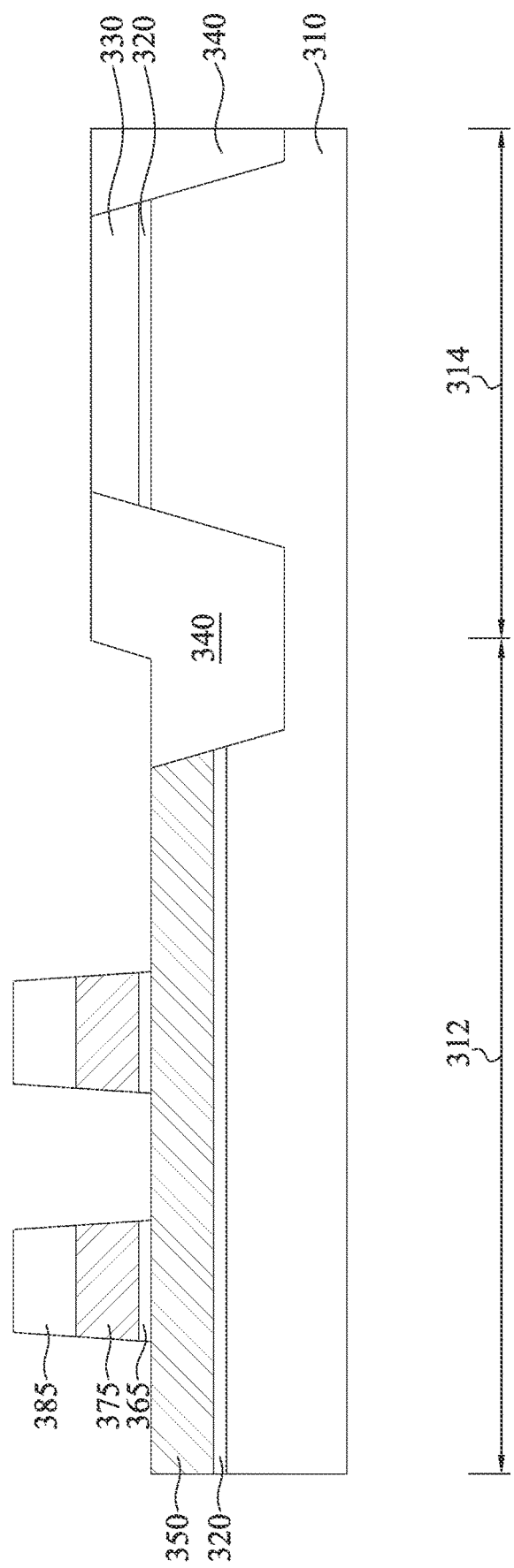

Reference is made to FIG. 22. The hard mask layer 380, the control gate film 370, and the dielectric film 360 in FIG. 21 are patterned to form hard masks 385, control gates 375, and dielectric layers 365, respectively. After the patterning of the hard mask layer 380, the control gate film 370, and the dielectric film 360, the patterned photoresist layer M2a (see FIG. 21) is then removed, and the removal method may be performed by solvent stripping or plasma ashing, for example.

Figure 23:
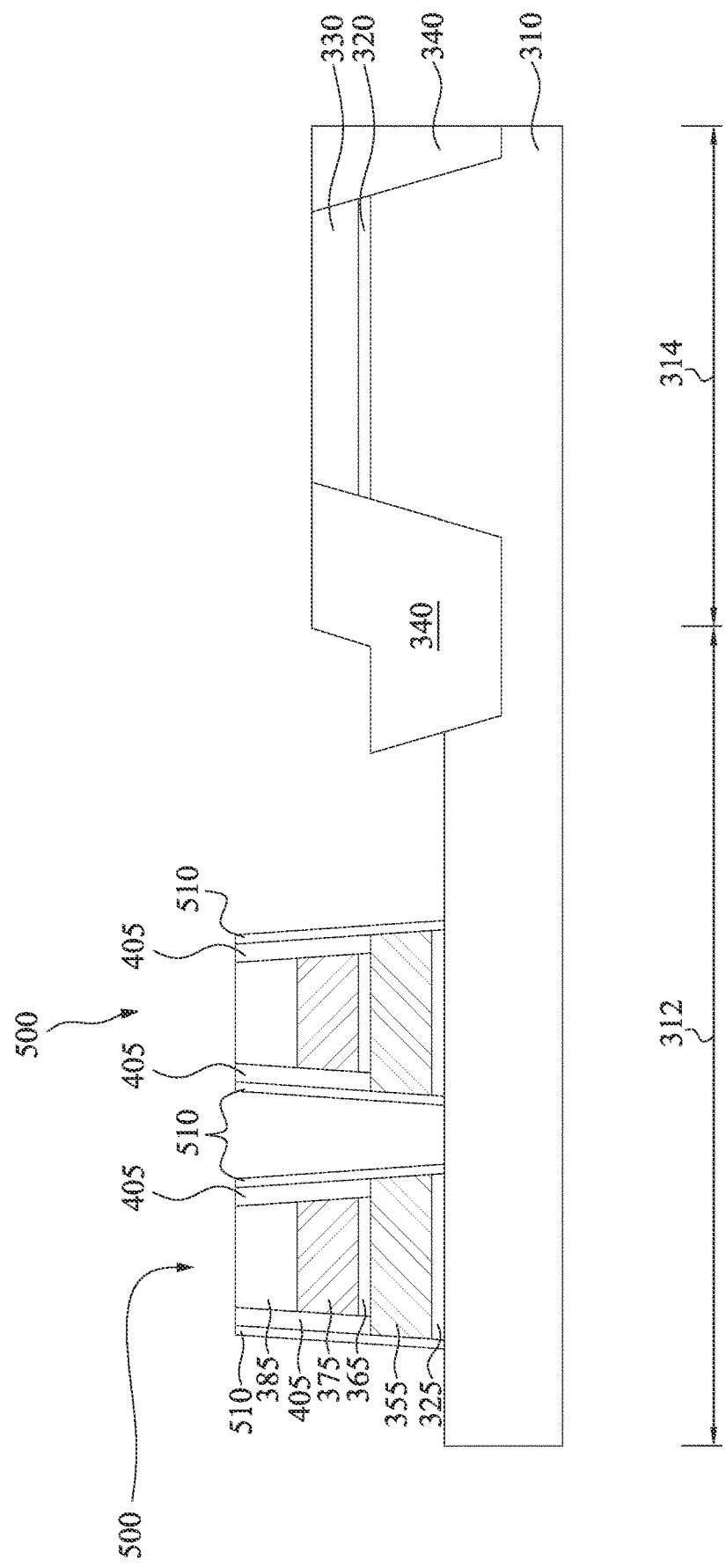

Reference is made to FIG. 23. Gate spacers 405 are formed on sidewalls of the hard masks 385, the control gates 375, and the dielectric layers 365. Materials and fabrication process details about the gate spacers 405 are similar to that about the gate spacers 405 in FIG. 13, and thus they are not repeated herein for the sake of brevity.

Subsequently, the floating gate layer 350 and the tunneling film 320 in FIG. 22 are patterned to form floating gates 355 and tunneling layers 325, respectively. As such, the tunneling layer 325, the floating gate 355, the dielectric layer 365, the control gate 375, and the hard mask 385 are referred to as a gate stack 500. Subsequently, spacer structures 510 are formed on sidewalls of the gate stacks 500. Materials and fabrication process details about the spacer structures 510 are similar to that about the gate spacers 405 in FIG. 13, and thus they are not repeated herein for the sake of brevity.

Figure 24:
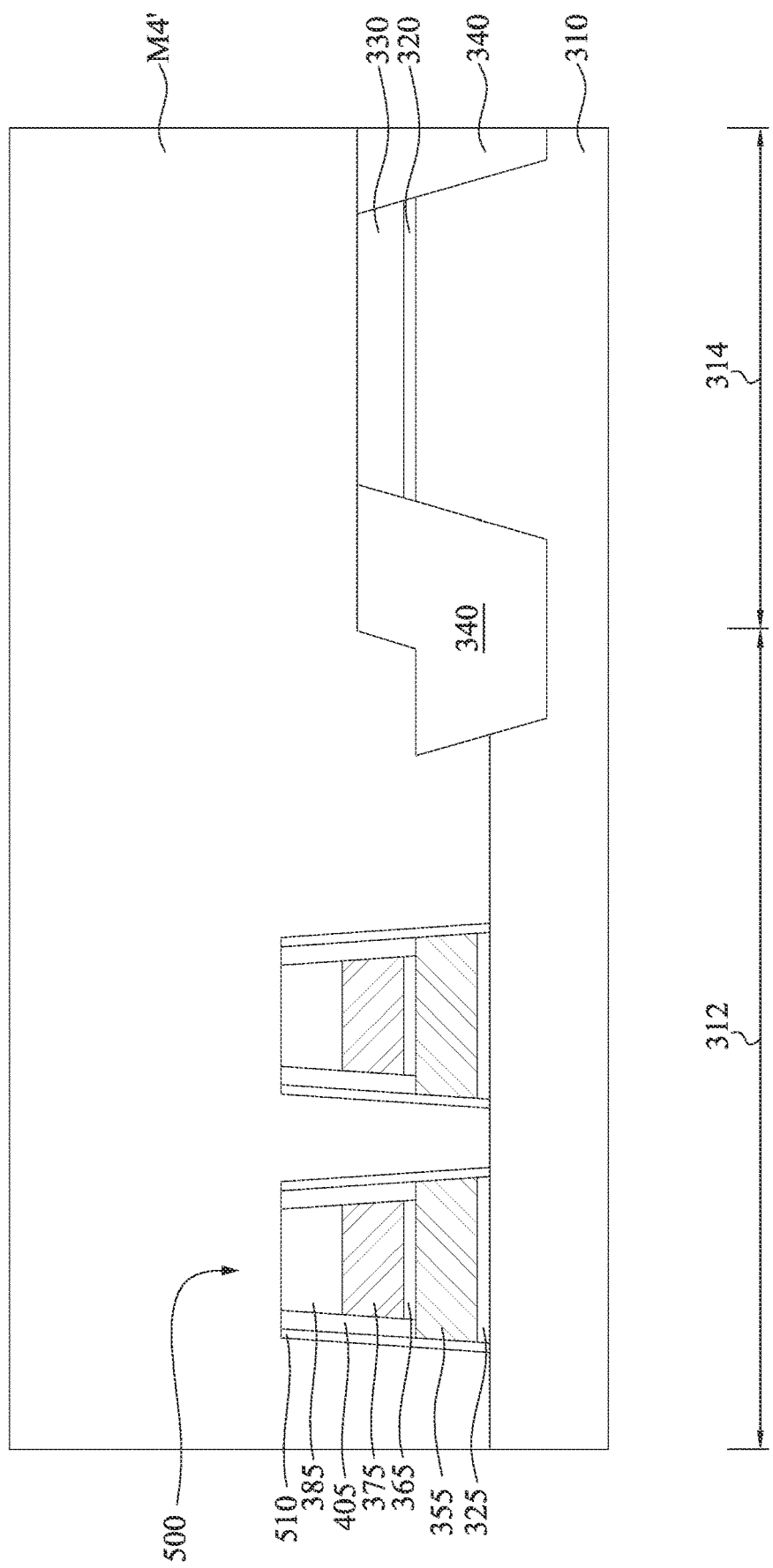
Figure 25:
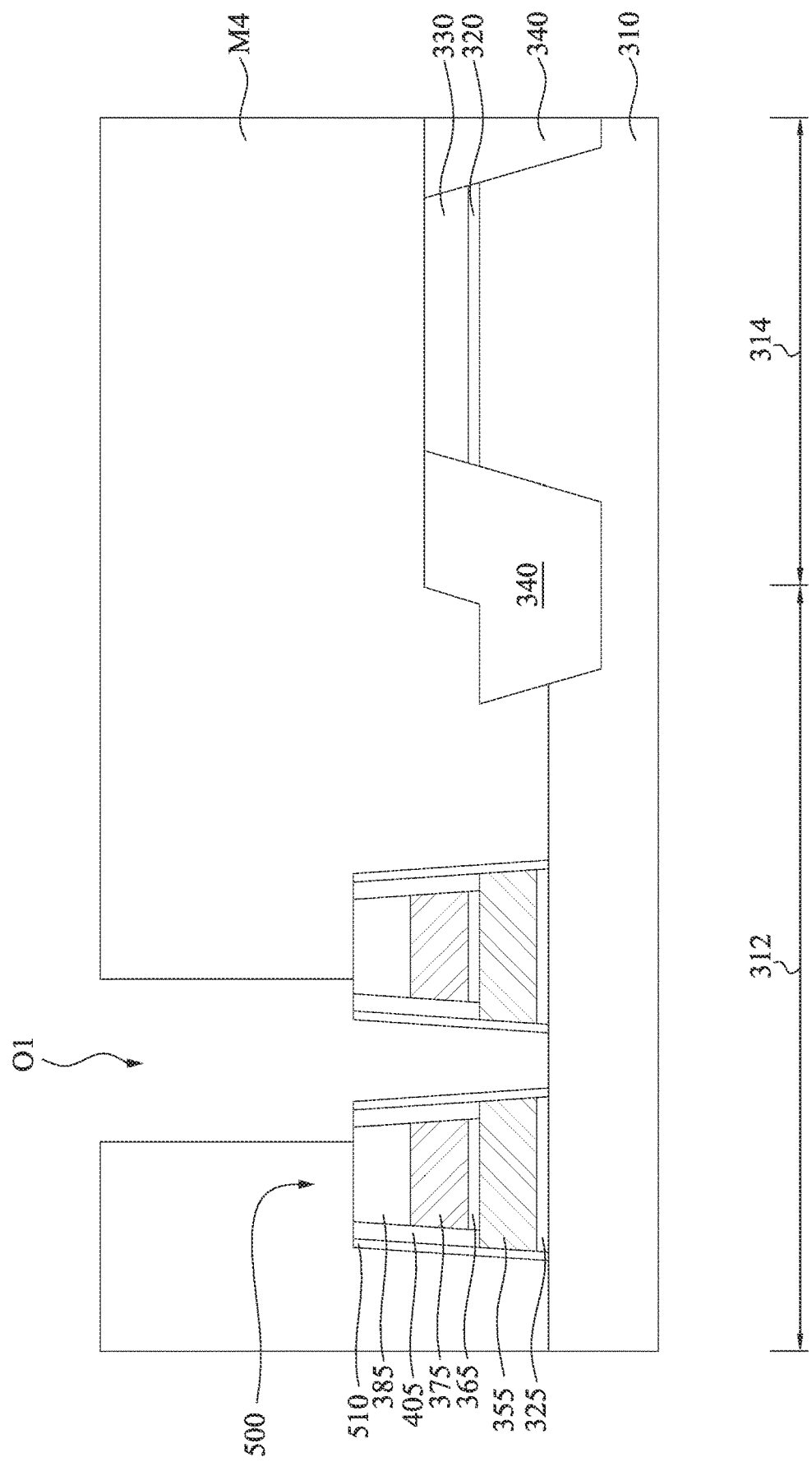

Reference is made to FIGS. 24 and 25. Another patterned photoresist layer M4 with at least one opening O1 is formed over the substrate 310, and the opening O1 exposes a region between the two of the gate stacks 400. For example, the patterned photoresist layer M4 is formed by a combination of spin coating, exposing and developing processes. Specifically, a photoresist layer M4' is formed over the structure of FIG. 23, and a patterning process is performed using a mask to remove at least a portion of the photoresist layer M4', such that the patterned photoresist layer M4 is formed as shown in FIG. 25.

In some embodiments, the photo mask used to pattern the photoresist layer M4' can be shown in FIGS. 2 and 33. For example, the main features 215 in FIG. 33 correspond to the opening O1 of the patterned photoresist layer M4. Since the details of the photo mask in FIGS. 2 and 33 are described above, a description in this regard will not be repeated hereinafter.

For example, the structure of FIG. 24 can be disposed on the wafer stage 120 of FIG. 1, and a photo mask is disposed on the reticle holder 130. The light source 110 then provides the radiation 112 to the photo mask to expose the photoresist layer M4'. The exposed photoresist layer M4' is then baked, developed, and hard baked to form the patterned photoresist layer M4 of FIG. 25.

Figure 26:
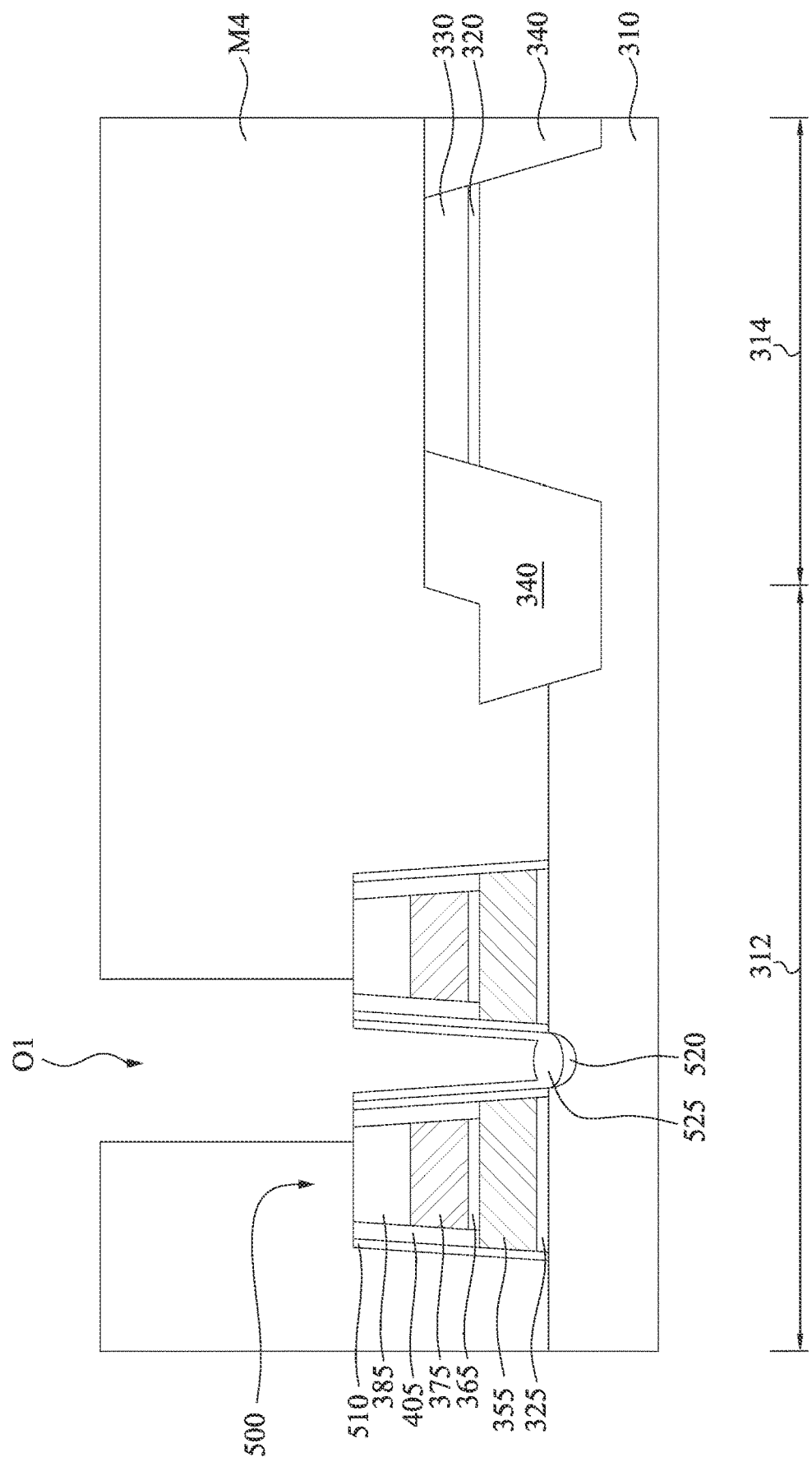

Reference is made to FIG. 26. At least one source region 520 is formed between two adjacent gate stacks 400. For example, ions are implanted into the areas exposed by the opening O1 to form the source region 520. A common source (CS) dielectric layer 525 is then formed over the source region 520. The CS dielectric layer 525 may be a dielectric isolation structure and may be formed by oxidizing the substrate 310, other suitable processes, or combinations thereof.

Figure 27:
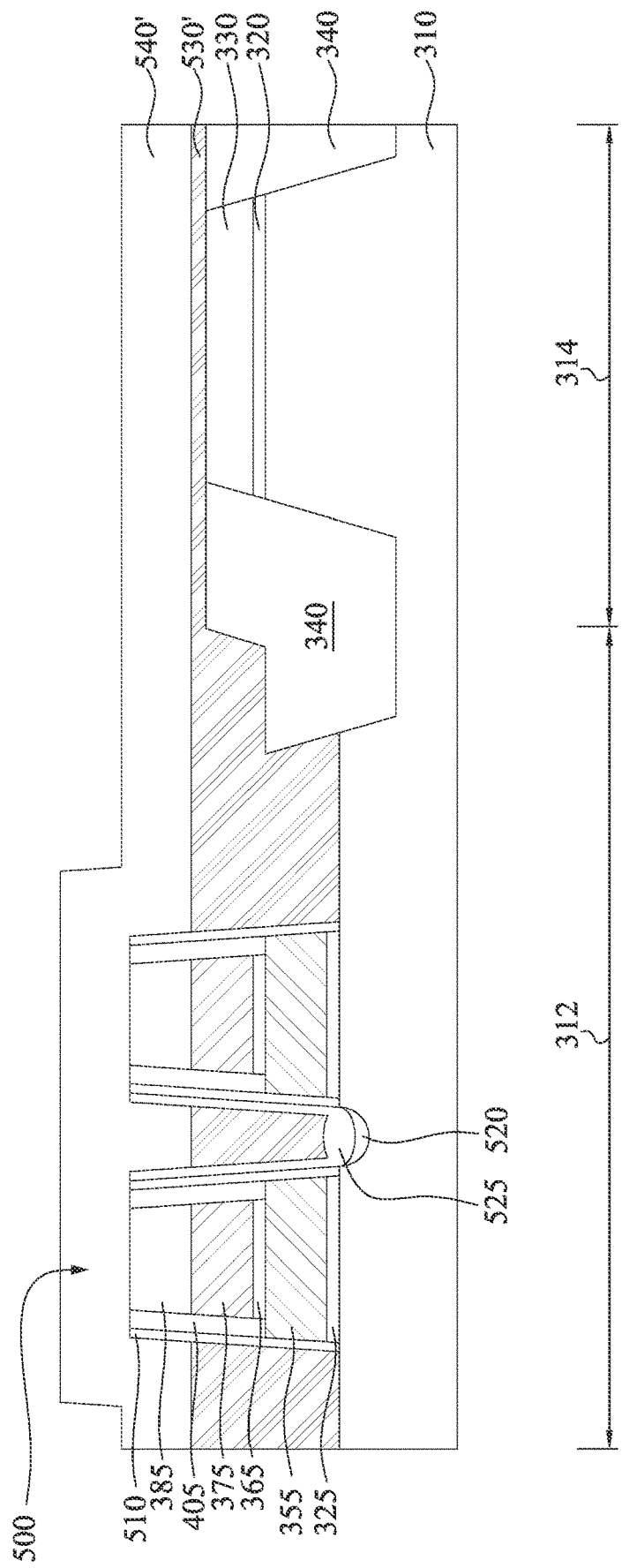

Reference is made to FIG. 27. The patterned photoresist layer M4 (see FIG. 26) is then removed, and the removal method may be performed by solvent stripping or plasma ashing, for example. A conductive material is deposited over the substrate 310, and the conductive material is patterned or etched back to be a conductive layer 530'. Subsequently, a hard mask layer 540' is formed over the conductive layer 530'. In some embodiments, the conductive layer 530' may be made of polysilicon or other suitable materials. In some embodiments, the hard mask layer 540' includes a SiN layer or other suitable materials.

Figure 28:
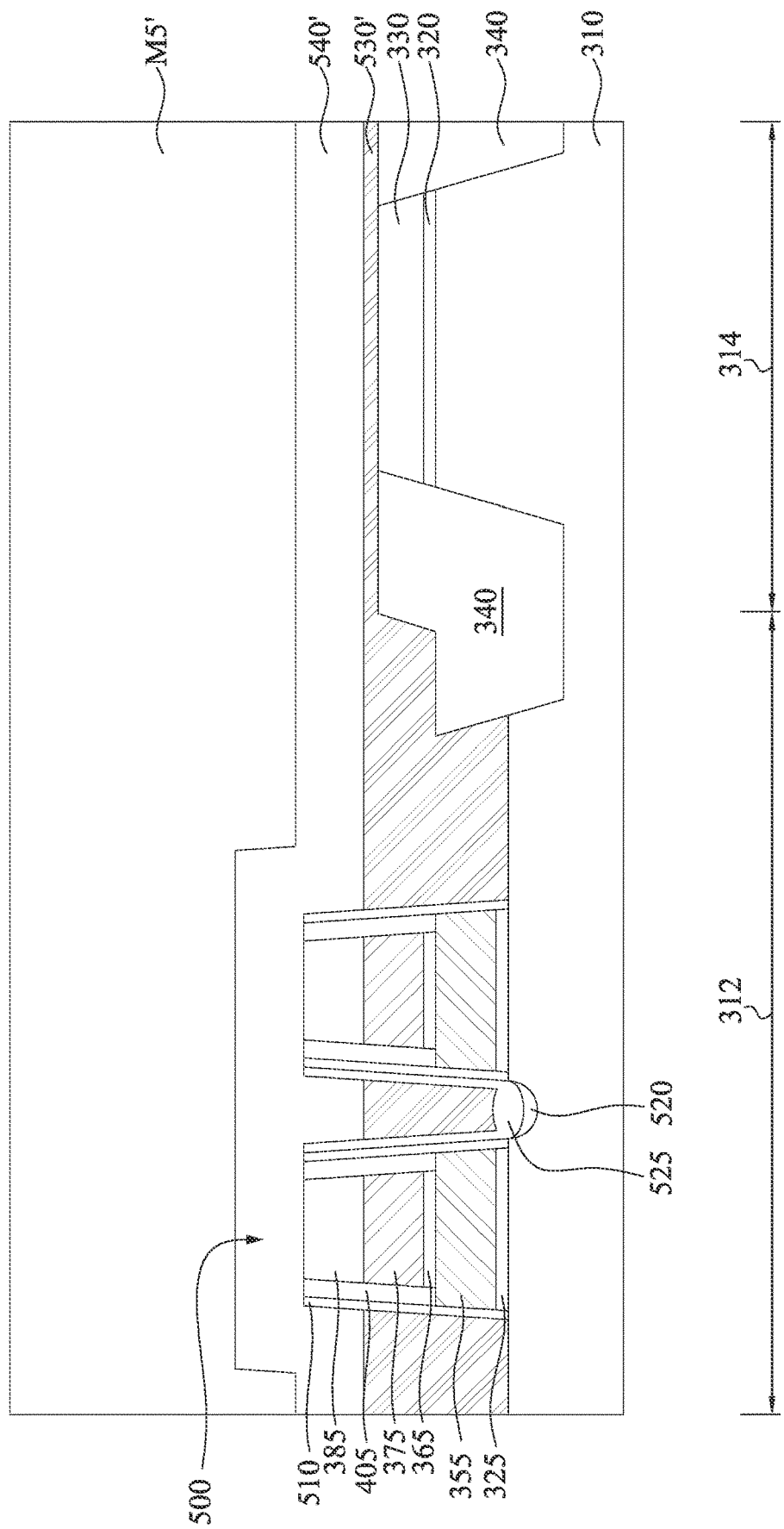
Figure 29:
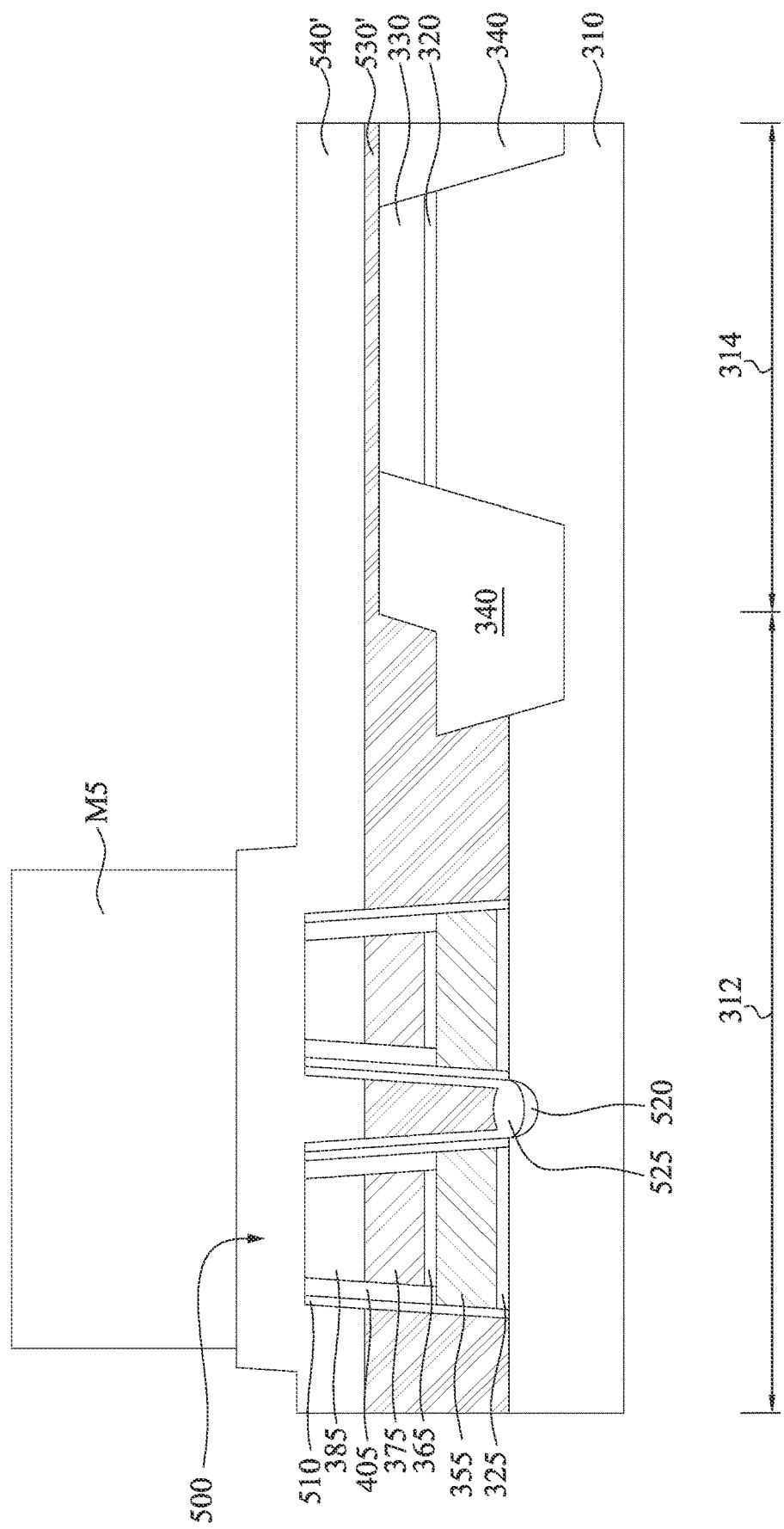

Reference is made to FIGS. 28 and 29. Another patterned photoresist layer M5 is formed over the gate stacks 500. For example, the patterned photoresist layer M5 is formed by a combination of spin coating, exposing and developing processes. Specifically, a photoresist layer M5' is formed over the structure of FIG. 27, and a patterning process is performed using a photo mask to remove at least a portion of the photoresist layer M5', such that the patterned photoresist layer M5 is formed as shown in FIG. 29. In some embodiments, the photo mask used to pattern the photoresist layer M5' can be shown in FIGS. 2 and 33. Since the details of the photo mask in FIGS. 2 and 33 are described above, a description in this regard will not be repeated hereinafter. For example, the structure of FIG. 28 can be disposed on the wafer stage 120 of FIG. 1, and a photo mask is disposed on the reticle holder 130. The light source 110 then provides the radiation 112 to the photo mask to expose the photoresist layer M5'. The exposed photoresist layer M5' is then baked, developed, and hard baked to form the patterned photoresist layer M5 of FIG. 29. That is, the patterned photoresist layer M5 is formed over the memory region 312 of the substrate 310 and not over the logic region 314 of the substrate 310.

Figure 30:
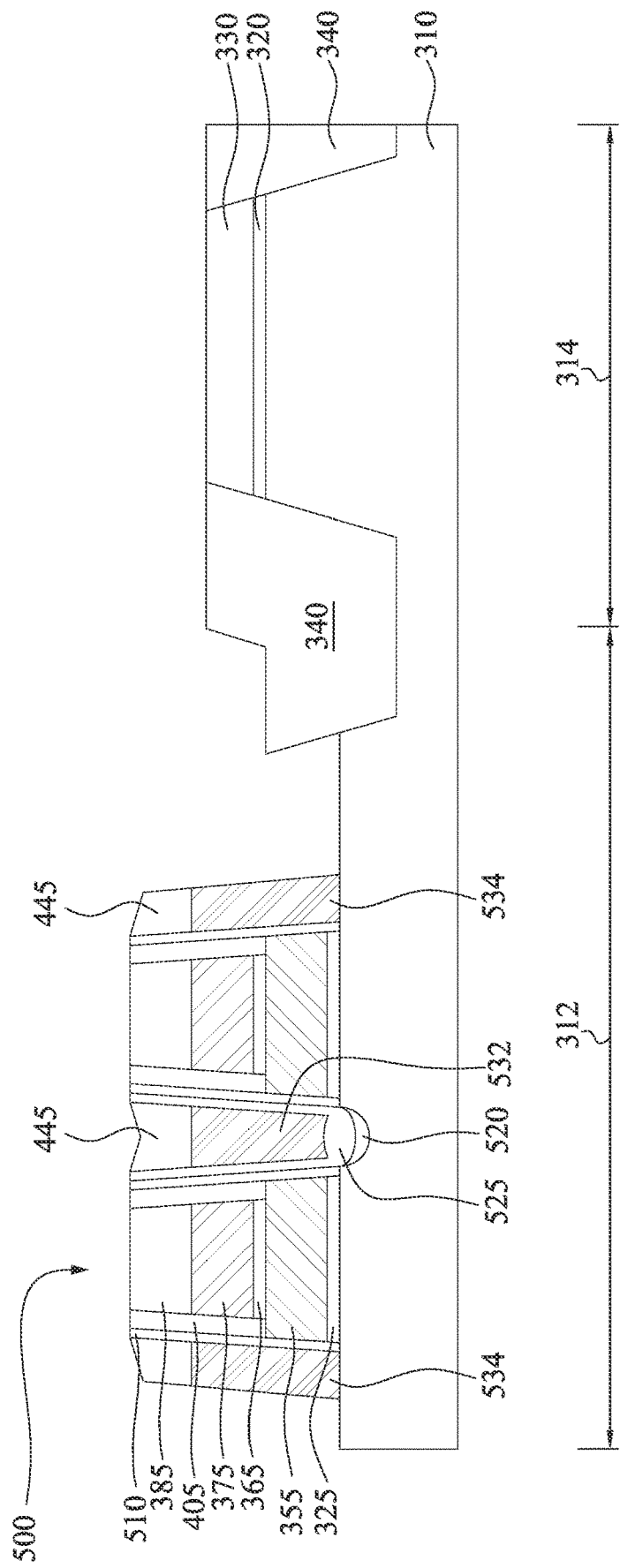

Reference is made to FIG. 30. An etching process is formed to pattern the hard mask layer 540' and the conductive layer 530' in FIG. 29. The hard mask layer 540' in FIG. 29 is patterned by using the patterned photoresist layer M5 as etching masks to form hard masks 530, and the conductive layer 530' is then patterned by using the hard masks 540 as etching masks to form an erase gate 532 and select gates 534. In some embodiments, the erase gate 532 and the select gates 524 may be made of polysilicon or other suitable materials.

Figure 31:
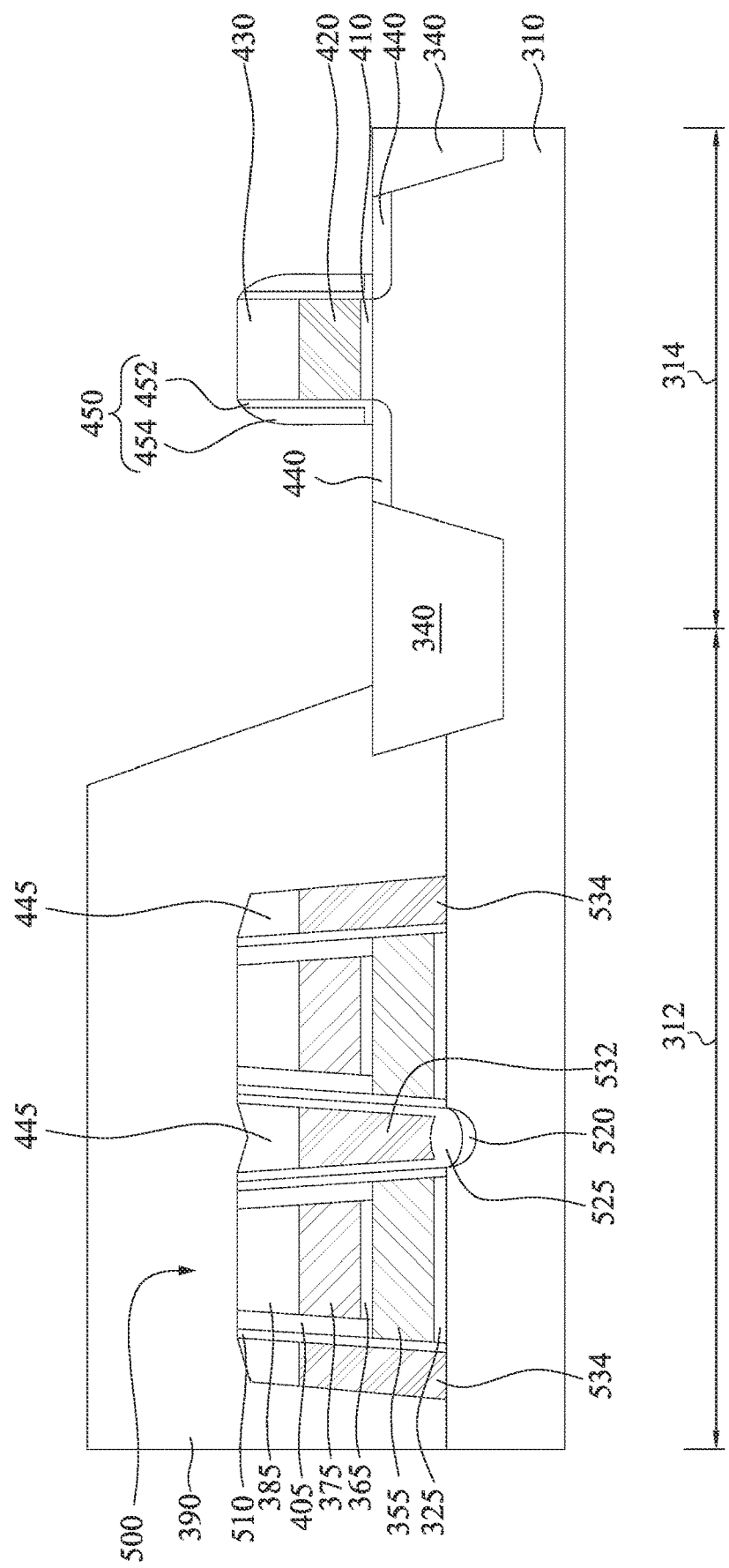

Reference is made to FIG. 31. A protection layer 390 is formed over the memory region 312 of the substrate 310, such that the protection layer 390 covers the structures formed over the substrate 310 (i.e., the gate stacks 500 and the gate spacers 405). Materials and fabrication process details about the protection layer 390 are similar to that about the protection layer 390 in FIG. 14, and thus they are not repeated herein for the sake of brevity.

The patterned pad layer 320 and the patterned mask layer 320 (see FIG. 30) are then removed to expose the logic region 314 of the substrate 310. Subsequently, a gate structure 420, a hard mask layer 430, LDD regions 440, and gate spacers 450 are formed over the logic region 314 of the substrate 310. Materials and fabrication process details about the gate structure 420, the hard mask layer 430, the LDD regions 440, and the gate spacers 450 are respectively similar to that about the gate structure 420, hard mask layer 430, the LDD regions 440, and the gate spacers 450 in FIG. 17, and thus they are not repeated herein for the sake of brevity.

Figure 32:
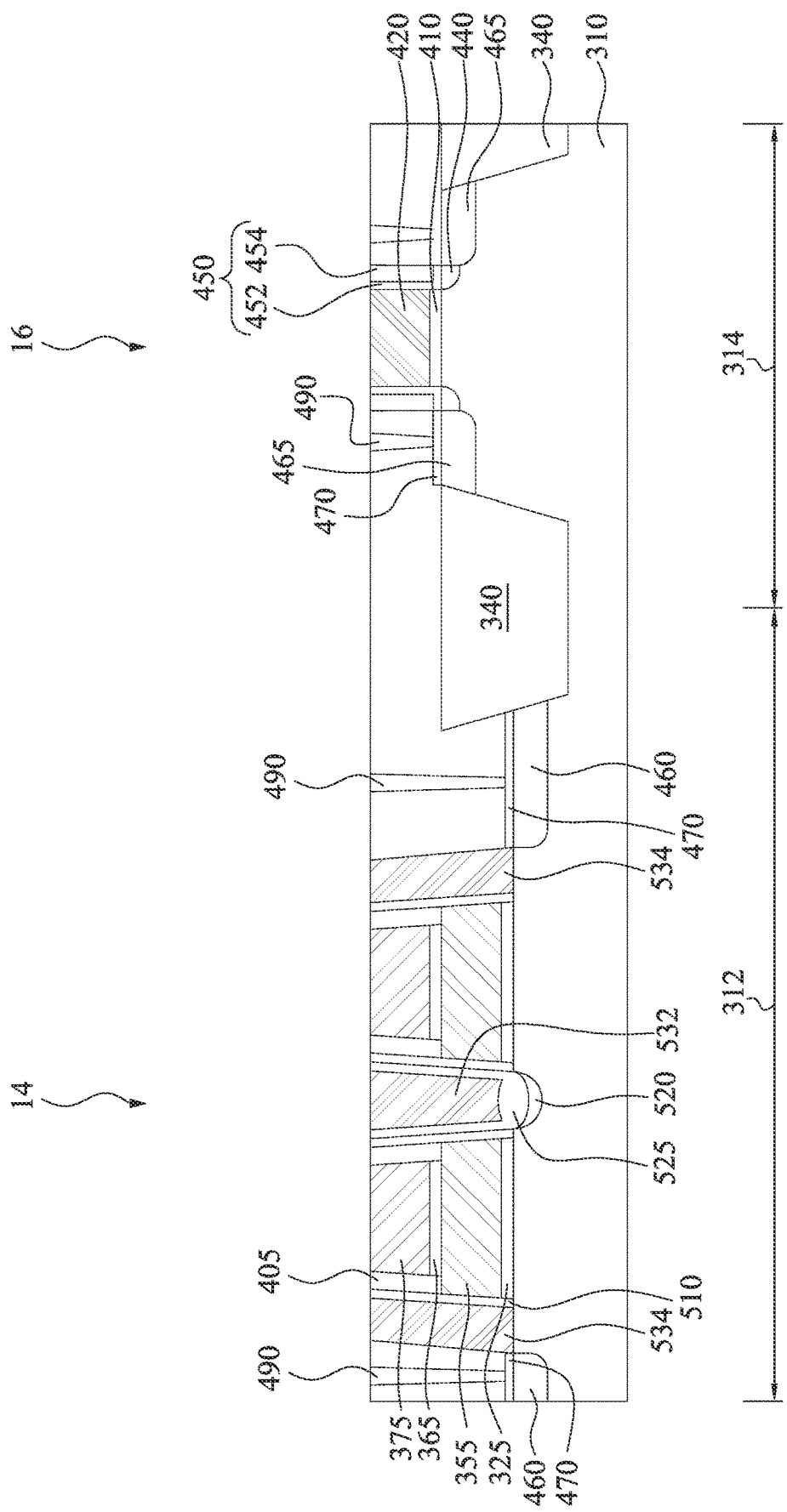

Reference is made to FIG. 32. Similar to the processes shown in FIGS. 18-20, the protection layer 390 (see FIG. 31) is removed. Source/drain features 460 and 465 are formed in the substrate 310. Metal alloy layers 470 are formed over the source/drain features 460 and 465. An interlayer dielectric (ILD) layer 480 (and a CESL) is formed over the substrate 310, and a planarization process is performed to level a top surface of the ILD layer 480 with a top surface of the control gates 375 and a top surface of the gate structure 420. Optionally, a replacement gate (RPG) process scheme is employed to the gate structure 420. Further, a plurality of contacts 490 are formed over the memory cell 14 and the logic transistor 16.

As such, at least one memory cell 14 and at least one logic transistor 16 are formed. The memory cell 14 includes two floating gates 355, two control gates 375, two dielectric layer 365, one erase gate 532, two select gates 534, one source region 520, and two drain region 460. The logic transistor 16 includes the gate structure 420 and the source/drain regions 465 on opposite sides of the gate structure 420.

Figure 35:
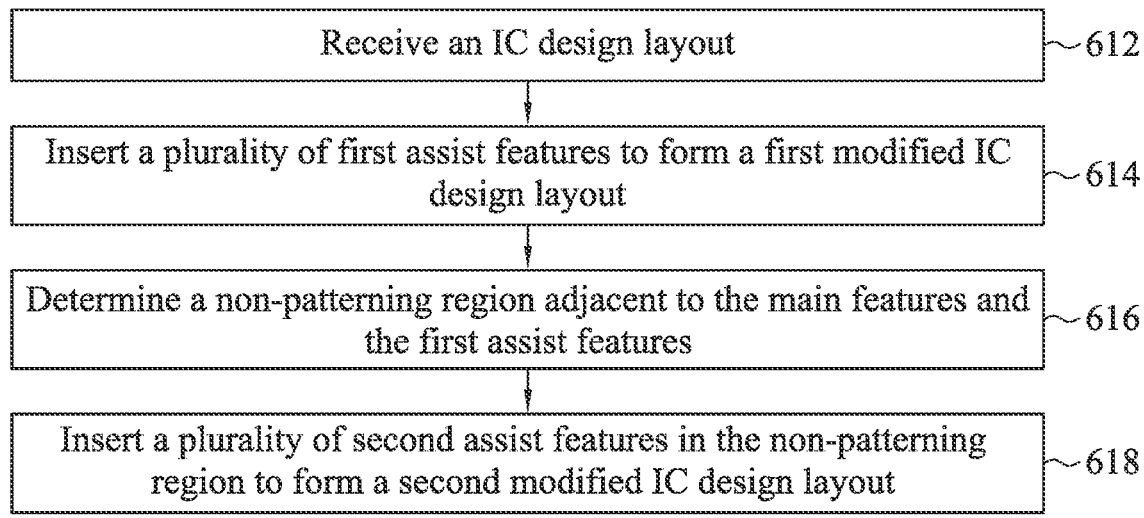
FIG. 35 is a flowchart of a method of modifying an IC design layout before mask fabrication according to various aspects of the present disclosure.

FIG. 35 is a flowchart of a method 600 of modifying an IC design layout before mask fabrication according to various aspects of the present disclosure. In some embodiments, the method 600 may be implemented in the mask data preparation 3732 of the mask house 3730 shown in FIG. 37. Further, the method 600 in FIG. 35 is an overview and details associated with each operation in the method 600 will be described in association with the subsequent figures in the present disclosure.

The method 600 includes an operation 612 by receiving an IC design layout. The IC design layout is presented in one or more data files having the information of the geometrical patterns. In some embodiments, the IC design layout is expressed in a GDS file format. In alternative embodiments, the IC design layout may be transmitted between the components in IC manufacturing system in alternate file formats such as DFII, CIF, OASIS, and/or any other suitable file type. The IC design layout includes various geometrical patterns representing features of an integrated circuit. For example, the IC design layout may include a plurality of main features (e.g., the main features 215 in FIGS. 3A-3D, 33, and 34B).

The method 600 further includes an operation 614 by inserting a plurality of first assist features to form a first modified IC design layout. The first assist features (e.g., the assist features 220 of FIGS. 3A-3D, 33, and 34B) are utilized to modify the shapes of main features to compensate for diffraction and/or other process effects in an lithography process, so that the shapes of the main features as formed in the final integrated circuit more closely matches the shapes of the main features in the IC design layout.

The method 600 further includes an operation 616 by determining a non-patterning region adjacent to the main features and the first assist features. In some embodiments, the non-patterning region corresponds to the non-patterning region 212b of FIG. 2 or the non-patterning region 212b' of FIG. 34A. In some embodiments, after the insertion of the first assist features, the total area of the main features (i.e., device features and scribe line features) and the first assist features is calculated, and a percentage of the total area to an area of an exposure field of a mask is determined. In some embodiment, the percentage is lower than 50%, e.g., about 20% to about 30%. In these cases, most of the radiation will pass through the photo mask and heats up the lens system (e.g., the lens system 150 in FIG. 1).

The method 600 further includes an operation 618 by inserting a plurality of second assist features in the non-patterning region to form a second modified IC design layout. The second assist features (e.g., the assist features 225 of FIGS. 3A-3D, 33, and 34B) are utilized to block the non-patterning region, such that a heating problem can be improved.

Figure 36:
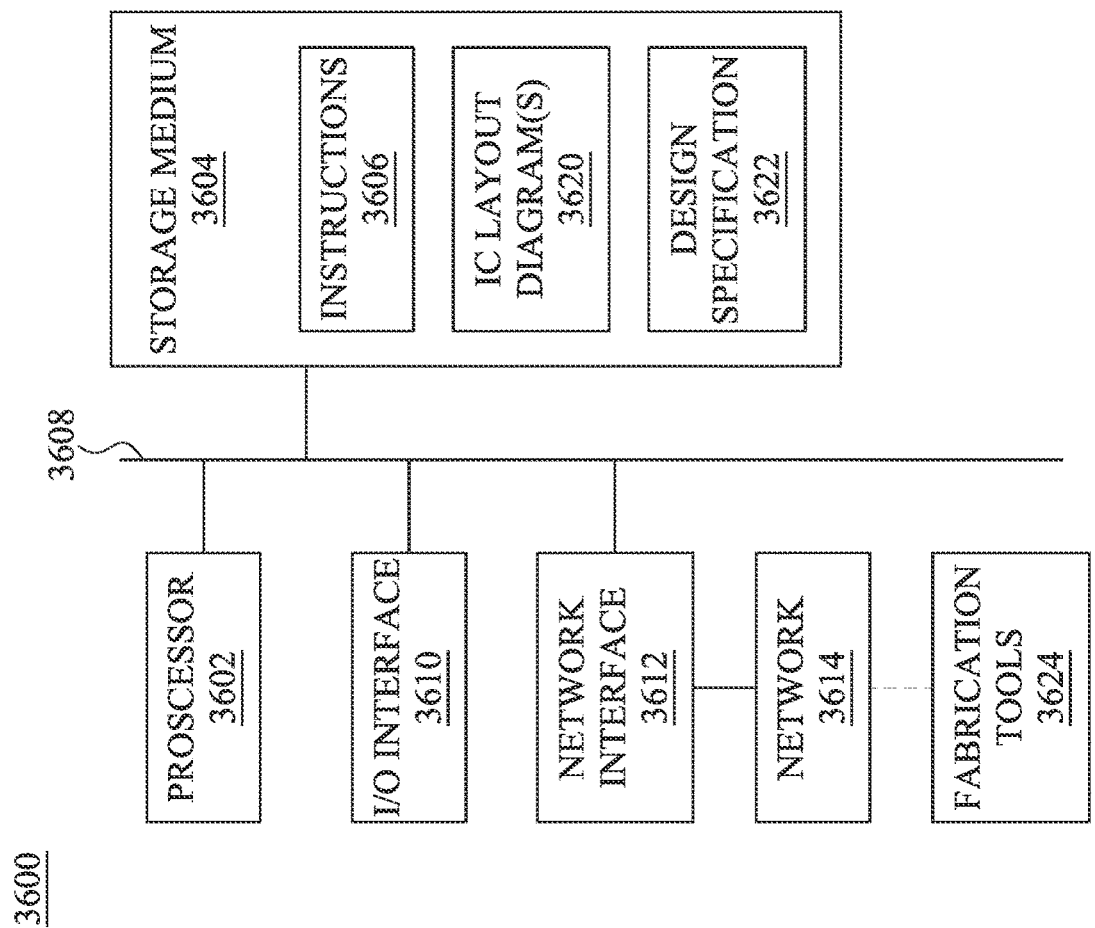
FIG. 36 is a block diagram of an IC device design system, in accordance with some embodiments of the present disclosure.

FIG. 36 is a block diagram of an IC device design system 3600, in accordance with some embodiments of the present disclosure. One or more operations of method 600 as discussed above with respect to FIG. 35, are implementable using the IC device design system 3600, in accordance with some embodiments.

In some embodiments, the IC device design system 3600 is a computing device including a processor 3602 and a non-transitory computer-readable storage medium 3604. The non-transitory computer-readable storage medium 3604, amongst other things, is encoded with, i.e., stores, computer program codes, i.e., a set of executable instructions 3606. Execution of the instructions 3606 by the hardware processor 3602 represents (at least in part) an IC device design system which implements a portion or all of, e.g., method 600 discussed above with respect to FIG. 35 (hereinafter, the noted processes and/or methods).

The processor 3602 is electrically coupled to the non-transitory computer-readable storage medium 3604 via a bus 3608. The processor 3602 is also electrically coupled to an I/O interface 3610 by the bus 3608. A network interface 3612 is also electrically connected to the processor 3602 via bus 3608. The network interface 3612 is connected to a network 3614, so that the processor 3602 and the non-transitory, computer-readable storage medium 3604 are capable of being connected to external elements via network 3614. The processor 3602 is configured to execute the instructions 3606 encoded in the non-transitory computer-readable storage medium 3604 in order to cause the IC device design system 3600 to be usable for performing a portion or all of the noted processes and/or methods. In one or more embodiments, the processor 3602 is a central processing unit (CPU), a multi-processor, a distributed processing system, an application specific IC (ASIC), and/or a suitable processing unit.

In one or more embodiments, the non-transitory computer-readable storage medium 3604 is an electronic, magnetic, optical, electromagnetic, infrared, and/or a semiconductor system (or apparatus or device). For example, the non-transitory computer-readable storage medium 3604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, non-transitory computer-readable storage medium 3604 includes a compact disk-read only memory (CD-ROM), a compact disk-read/write (CD-R/W), and/or a digital video disc (DVD).

In one or more embodiments, the non-transitory computer-readable storage medium 3604 stores the instructions 3606 configured to cause the IC device design system 3600 to be usable for performing a portion or all of the noted processes and/or methods. In one or more embodiments, the non-transitory computer-readable storage medium 3604 also stores information which facilitates performing a portion or all of the noted processes and/or methods. In various embodiments, the non-transitory computer-readable storage medium 3604 stores one or a combination of at least one IC layout design diagram 3620 or at least one design specification 3622, each discussed above with respect to FIG. 35.

The IC device design system 3600 includes I/O interface 3610. The I/O interface 3610 is coupled to external circuitry. In various embodiments, the I/O interface 3610 includes one or a combination of a keyboard, keypad, mouse, trackball, trackpad, display, touchscreen, and/or cursor direction keys for communicating information and commands to and/or from the processor 3602.

The IC device design system 3600 also includes network interface 3612 coupled to the processor 3602. The network interface 3612 allows IC device design system 3600 to communicate with network 3614, to which one or more other computer systems are connected. The network interface 3612 includes wireless network interfaces such as BLUETOOTH, WIFI, WIMAX, GPRS, or WCDMA; or wired network interfaces such as ETHERNET, USB, or IEEE-1364. In one or more embodiments, a portion or all of the noted processes and/or methods, is implemented in two or more systems 3600.

The IC device design system 3600 is configured to receive information through the I/O interface 3610. The information received through the I/O interface 3610 includes one or a combination of at least one design rule instructions, at least one set of criteria, at least one design rule, at least one DRM, and/or other parameters for processing by processor 3602. The information is transferred to the processor 3602 via the bus 3608. The IC device design system 3600 is configured to transmit and/or receive information related to a user interface through the I/O interface 3610.

The IC device design system 3600 also includes one or more fabrication tools 3624 coupled to the network 3614. The fabrication tools 3624 are configured to fabricate the IC layout designed by the IC device design system 3600. The fabrication tools 3624 includes deposition tools (e.g., chemical vapor deposition (CVD) apparatuses, physical vapor deposition (PVD) apparatuses), etching tools (e.g., dry etching apparatuses, wet etching apparatuses), planarization tools (e.g., CMP apparatuses), or other tools used in fabricating IC devices including the IC layout designed by the IC device design system 3600.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, an IC layout diagram is generated using a tool such as VIRTUOSO® available from CADENCE DESIGN SYSTEMS, Inc., or another suitable layout generating tool.

In some embodiments, the processes are realized as functions of a program stored in a non-transitory computer-readable recording medium. Examples of a non-transitory computer-readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By being usable to implement one or more operations of method 600 of FIG. 35, the IC device design system 3600 and a non-transitory computer-readable storage medium, e.g., non-transitory computer-readable storage medium 3604, enable the benefits discussed above with respect to method 600 of FIG. 35.

Figure 37:
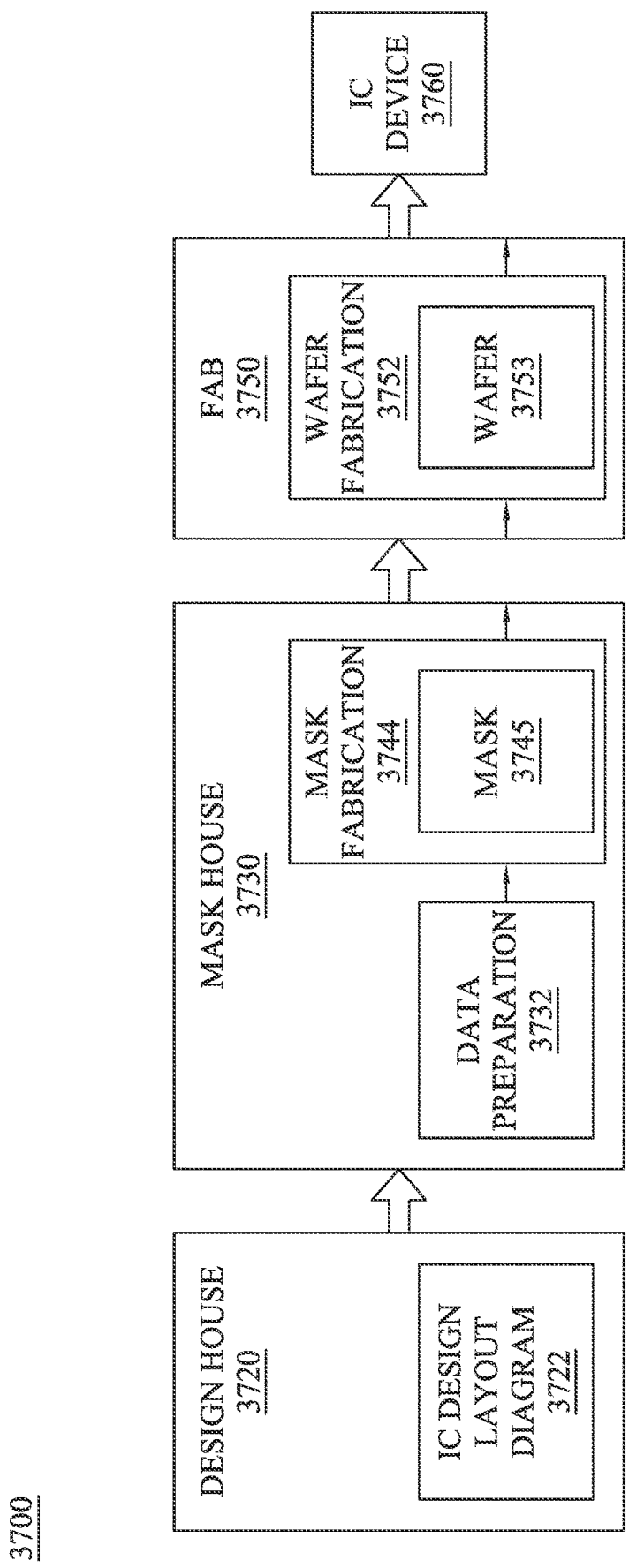
FIG. 37 is a block diagram of IC manufacturing system, and an IC manufacturing flow associated therewith, in accordance with some embodiments of the present disclosure.

FIG. 37 is a block diagram of IC manufacturing system 3700, and an IC manufacturing flow associated therewith, in accordance with some embodiments of the present disclosure. In some embodiments, based on a layout design, at least one of (A) one or more masks or (B) at least one component in a layer of a semiconductor IC is fabricated using the IC manufacturing system 3700.

In FIG. 37, the IC manufacturing system 3700 includes entities, such as a design house 3720, a mask house 3730, and an IC manufacturer/fabricator ("fab") 3750, that interact with one another in the design, development, and manufacturing cycles and/or services related to manufacturing an IC device 3760 (e.g., the devices in FIGS. 20 and/or 31). The entities in system 3700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 3720, mask house 3730, and IC fab 3750 is owned by a single larger company. In some embodiments, two or more of design house 3720, mask house 3730, and IC fab 3750 coexist in a common facility and use common resources.

Design house (or design team) 3720 generates an IC design layout diagram (or design) 3722 based on method 600 of FIG. 35 and discussed above with respect to FIGS. 2-4C and 33-34B. The IC design layout diagram 3722 includes various geometrical patterns that correspond to patterns of metal, oxide, or semiconductor layers that make up the various components of IC device 3760 to be fabricated. The various layers combine to form various IC features. For example, a portion of IC design layout diagram 3722 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 3720 implements a proper design procedure including the method 600 of FIG. 35 and discussed above with respect to FIGS. 2-4C and 33-34B, to form IC design layout diagram 3722. The design procedure includes one or more of logic design, physical design or place and route. The IC design layout diagram 3722 is presented in one or more data files having information of the geometrical patterns. For example, the IC design layout diagram 3722 can be expressed in a GDSII file format or DFII file format.

The mask house 3730 includes data preparation 3732 and mask fabrication 3744. The mask house 3730 uses the IC design layout diagram 3722 to manufacture one or more masks 3745 (correspond to the photo masks 200 and/or 200' in FIGS. 2 and 34) to be used for fabricating the various layers of IC device 3760 according to the IC design layout diagram 3722. The mask house 3730 performs mask data preparation 3732, where IC design layout diagram 3722 is translated into a representative data file ("RDF"). The mask data preparation 3732 provides the RDF to mask fabrication 3744. The mask fabrication 3744 includes a mask writer. A mask writer converts the RDF to an image on a substrate, such as a mask (reticle) 3745 or a semiconductor wafer 3753. The design layout diagram 3722 is manipulated by the mask data preparation 3732 to comply with particular characteristics of the mask writer and/or requirements of IC fab 3750. In FIG. 37, the mask data preparation 3732 and the mask fabrication 3744 are illustrated as separate elements. In some embodiments, the mask data preparation 3732 and the mask fabrication 3744 are collectively referred to as mask data preparation.

In some embodiments, the mask data preparation 3732 includes optical proximity correction (OPC) which uses lithography enhancement techniques to compensate for image errors, such as those that can arise from diffraction, interference, other process effects and the like. OPC adjusts IC design layout diagram 3722. In some embodiments, the mask data preparation 3732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 3732 includes a mask rule checker (MRC) that checks the IC design layout diagram 3722 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 3722 to compensate for limitations during mask fabrication 3744, which may undo part of the modifications performed by OPC in order to meet mask creation rules.

In some embodiments, mask data preparation 3732 includes lithography process checking (LPC) that simulates processing that will be implemented by IC fab 3750 to fabricate the IC device 3760. LPC simulates this processing based on IC design layout diagram 3722 to create a simulated manufactured device, such as IC device 3760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 3722.

It should be understood that the above description of mask data preparation 3732 has been simplified for the purposes of clarity. In some embodiments, data preparation 3732 includes additional features such as a logic operation (LOP) to modify the IC design layout diagram 3722 according to manufacturing rules. Additionally, the processes applied to IC design layout diagram 3722 during data preparation 3732 may be executed in a variety of different orders.

After mask data preparation 3732 and during mask fabrication 3744, a mask 3745 or a group of masks 3745 are fabricated based on the modified IC design layout diagram 3722. In some embodiments, mask fabrication 3744 includes performing one or more lithographic exposures based on IC design layout diagram 3722. In some embodiments, an electron-beam (e-beam) or a mechanism of multiple e-beams is used to form a pattern on a mask (photomask or reticle) 3745 based on the modified IC design layout diagram 3722. The mask 3745 can be formed in various technologies. In some embodiments, the mask 3745 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 3745 includes a transparent substrate (e.g., fused quartz) and an opaque material (e.g., chromium) coated in the opaque regions of the binary mask. In another example, the mask 3745 is formed using a phase shift technology. In a phase shift mask (PSM) version of the mask 3745, various features in the pattern formed on the phase shift mask are configured to have proper phase difference to enhance the resolution and imaging quality. In various examples, the phase shift mask can be attenuated PSM or alternating PSM. The mask(s) generated by mask fabrication 3744 is used in a variety of processes. For example, such a mask(s) is used in an ion implantation process to form various doped regions in semiconductor wafer 3753, in an etching process to form various etching regions in semiconductor wafer 3753, and/or in other suitable processes.

The IC fab 3750 includes wafer fabrication 3752. The IC fab 3750 is an IC fabrication business that includes one or more manufacturing facilities for the fabrication of a variety of different IC products. In some embodiments, the IC Fab 3750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

The IC fab 3750 uses the mask(s) 3745 fabricated by the mask house 3730 to fabricate the IC device 3760. Thus, IC fab 3750 at least indirectly uses IC design layout diagram 3722 to fabricate IC device 3760. In some embodiments, the wafer 3753 is fabricated by the IC fab 3750 using mask(s) 3745 to form IC device 3760. In some embodiments, the IC fabrication includes performing one or more lithographic exposures based at least indirectly on IC design layout diagram 3722. The wafer 3753 includes a silicon substrate or other proper substrate having material layers formed thereon. The wafer 3753 further includes one or more of various doped regions, dielectric features, multilevel interconnects, and the like (formed at subsequent manufacturing steps).

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the risk of image distortion caused by heating problems of lens can be reduced due to the addition of the assist features in the non-patterning region of the photo mask. Another advantage is that the addition of the assist features in the non-patterning region of the photo mask can be fabricated with the main features, and is not burden manufacturing cost of the photo mask. Yet another advantage is that since the assist features in the non-patterning region are far from the main features, the present of the assist features in the non-patterning region does not disturb the imaging of the main features on the wafer.

According to some embodiments, a photo mask includes a plurality of device features, a first assist feature, and a second assist feature. The device features are in a patterning region of a device region. The first assist feature are in the patterning region and adjacent to the device features. The first assist feature is for correcting an optical proximity effect in a photolithography process. The second assist feature is in a non-patterning region of the device region. The second assist feature is a sub-resolution correction feature, and a first distance between the second assist feature and one of the device features closest to the second assist feature is greater than a second distance between adjacent two of the device features.

According to some embodiments, a method includes forming a floating gate material over a memory region of a substrate. A dielectric film, a control gate film, and a hard mask layer are deposited over the floating gate material and a logic region of the substrate. After depositing the hard mask layer, a photoresist layer is deposited over the memory region and the logic region of the substrate. The photoresist layer is patterned by using a photo mask to form a patterned photoresist layer over the memory region of a substrate. The photo mask includes a main feature and two first assist features. The main feature defines the patterned photoresist layer, and a portion of radiation for exposing the photoresist layer passing through a space between the two first assist features is incident on a portion of the photoresist layer over the logic region of the substrate. The hard mask layer is patterned to form a hard mask over the memory region of the substrate by using the patterned photoresist layer as a first etch mask. The control gate film, the dielectric film, and the floating gate material are patterned by using the hard mask as a second etch mask to form a gate stack.

According to some embodiments, a method includes forming a gate stack including a floating gate and a control gate over a memory region of a substrate. A protection layer is deposited to cover the gate stack and expose a logic region of the substrate. After depositing the protection layer, a gate material and a hard mask layer are deposited over the logic region of the substrate. After depositing the hard mask layer, a photoresist layer is deposited over the memory region and the logic region of the substrate. A radiation is projected to the photoresist layer through a photo mask to expose the photoresist layer. The photo mask includes a patterning region and a non-patterning region. A portion of the radiation passing through the patterning region is incident on a portion of the protection layer over the memory region of the substrate, and another portion of the radiation passing through the non-patterning region is incident on another portion of the protection layer over the logic region of the substrate. The photo mask includes device features in the patterning region and first assist features in the non-patterning region. After projecting the radiation to the photoresist layer, the photoresist layer is developed to form a patterned photoresist layer defined by the device features. The hard mask layer and the gate material are patterned by using the patterned photoresist layer as an etch mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a floating gate material over a memory region of a substrate;

depositing a dielectric film, a control gate film, and a hard mask layer over the floating gate material and a logic region of the substrate;

after depositing the hard mask layer, depositing a photoresist layer over the memory region and the logic region of the substrate;

patterning the photoresist layer by using a photo mask to form a patterned photoresist layer over the memory region of a substrate, wherein the photo mask comprises a main feature and two first assist features, the main feature defines the patterned photoresist layer, and a portion of radiation for exposing the photoresist layer passing through a space between the two first assist features is incident on a portion of the photoresist layer over the logic region of the substrate;

patterning the hard mask layer to form a hard mask over the memory region of the substrate by using the patterned photoresist layer as a first etch mask; and patterning the control gate film, the dielectric film, and the floating gate material by using the hard mask as a second etch mask to form a gate stack.

2. The method of claim 1, wherein a distance between the main feature and any one of the first assist features is greater than about 1 um and less than a length of an exposure field of the photo mask.

3. The method of claim 1, wherein the first assist features are sub-resolution assist features.

4. The method of claim 1, wherein patterning the photoresist layer comprises removing the portion of the photoresist layer over the logic region of the substrate.

5. The method of claim 1, wherein patterning the photoresist layer is such that there is no remaining photoresist layer over the logic region of the substrate.

6. The method of claim 1, wherein the photo mask further comprises a second assist feature for correcting an optical proximity effect in a photolithography process for patterning the photoresist layer.

7. A method comprising:
forming a gate stack comprising a floating gate and a control gate over a memory region of a substrate;
depositing a protection layer covering the gate stack and exposing a logic region of the substrate;
after depositing the protection layer, depositing a gate material and a hard mask layer over the logic region of the substrate;
after depositing the hard mask layer, depositing a photoresist layer over the memory region and the logic region of the substrate;
projecting a radiation to the photoresist layer through a photo mask to expose the photoresist layer, wherein the photo mask includes a patterning region and a non-patterning region, a portion of the radiation passing through the patterning region is incident on a portion of the protection layer over the memory region of the substrate, and another portion of the radiation passing through the non-patterning region is incident on another portion of the protection layer over the logic region of the substrate, wherein the photo mask comprises device features in the patterning region and first assist features in the non-patterning region;
after projecting the radiation to the photoresist layer, developing the photoresist layer to form a patterned photoresist layer defined by the device features; and
patterning the hard mask layer and the gate material by using the patterned photoresist layer as an etch mask.

8. The method of claim 7, wherein a number of the first assist features is greater than a number of the device features.

9. The method of claim 7, wherein a first area of the photo mask occupied by the first assist features is greater than a second area of the photo mask occupied by the device features.

10. The method of claim 7, wherein the photo mask further comprises a second assist feature in the patterning region.

11. The method of claim 7, wherein the first assist features are sub-resolution assist features.

12. The method of claim 7, wherein any of the device features is free from being disposed in the non-patterning region of the photo mask.

13. A method comprising:
sequentially forming a floating gate material, a dielectric film, a control gate film, and a hard mask layer over a substrate;
depositing a first photoresist layer over the hard mask layer;
patterning the first photoresist layer by using a first photo mask to form a patterned first photoresist layer over a memory region of a substrate, wherein the first photo mask comprises:
a plurality of first device features configured to form a pattern of the patterned first photoresist layer; and
a first sub-resolution assist feature, wherein a first distance between the first sub-resolution assist feature and one of the first device features closest to the first sub-resolution assist feature is greater than a second distance between adjacent two of the first device features;
patterning the hard mask layer to form a plurality of hard masks over a memory region of the substrate by using the patterned first photoresist layer as a first etch mask; and
patterning the control gate film and the dielectric film by using the hard masks as second etch masks to form a plurality of control gates and a plurality of dielectric layers respectively between the control gates and the floating gate material.

14. The method of claim 13, wherein the first photo mask further comprises a second sub-resolution assist feature configured for correcting an optical proximity effect of the first device features in a photolithography process for patterning the first photoresist layer.

15. The method of claim 14, wherein a third distance between the second sub-resolution assist feature and one of the first device features closest to the second sub-resolution assist feature is less than the first distance between the first sub-resolution assist feature and said one of the first device features closest to the first sub-resolution assist feature.

16. The method of claim 14, wherein the second sub-resolution assist feature is located in a region of the first photo mask corresponding to the memory region of the substrate.

17. The method of claim 13, wherein the first sub-resolution assist feature is located in a region of the first photo mask corresponding to a logic region of the substrate.

18. The method of claim 13, further comprising:
forming a plurality of gate spacers to surround the control gates and the dielectric layers; and
patterning the floating gate material to form a plurality of floating gates over the memory region of the substrate by using the control gates, the dielectric layers, and the gate spacers as third etch masks.

19. The method of claim 18, further comprising:
forming a second photoresist layer over the substrate;
patterning the second photoresist layer by using a second photo mask to form an opening in the second photoresist layer to expose the hard masks and a portion of the substrate between the floating gates, wherein the second photo mask comprises:
a second device feature configured to form the opening in the second photoresist layer; and
a third sub-resolution assist feature located in a region of the second photo mask corresponding to a logic region of the substrate.

20. The method of claim 19, wherein a distance between the second device feature and the third sub-resolution assist feature is greater than about 1 um and less than a length of an exposure field of the second photo mask.

* * * * *